(12) United States Patent
Yabe

(10) Patent No.: US 11,087,800 B1
(45) Date of Patent: Aug. 10, 2021

(54) SENSE AMPLIFIER ARCHITECTURE PROVIDING SMALL SWING VOLTAGE SENSING

(71) Applicant: SanDisk Technologies LLC, Addison, TX (US)

(72) Inventor: Hiroki Yabe, Yokohama (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/845,735

(22) Filed: Apr. 10, 2020

(51) Int. Cl.
| | |
|---|---|
| *G11C 16/04* | (2006.01) |
| *G11C 7/06* | (2006.01) |
| *H01L 27/11582* | (2017.01) |
| *G11C 16/26* | (2006.01) |
| *G11C 16/24* | (2006.01) |
| *H01L 27/11556* | (2017.01) |

(52) U.S. Cl.
CPC .............. *G11C 7/065* (2013.01); *G11C 16/24* (2013.01); *G11C 16/26* (2013.01); *H01L 27/11556* (2013.01); *H01L 27/11582* (2013.01)

(58) Field of Classification Search
CPC ........... G11C 7/065; G11C 7/06; G11C 16/26; G11C 16/24; G11C 16/10
See application file for complete search history.

(56) References Cited

U.S. PATENT DOCUMENTS

| | | | |
|---|---|---|---|
| 6,711,079 B2 | 3/2004 | Kang | |
| 6,754,121 B2 | 6/2004 | Worley | |
| 9,042,193 B2 | 5/2015 | Chen et al. | |
| 9,361,976 B2 | 6/2016 | Siau et al. | |
| 2002/0126531 A1* | 9/2002 | Hosono | G11C 11/5621 365/185.17 |
| 2004/0125651 A1* | 7/2004 | Toda | G11C 11/5628 365/185.03 |
| 2007/0035999 A1* | 2/2007 | Kim | G11C 16/10 365/185.12 |
| 2016/0071606 A1* | 3/2016 | Kodama | G11C 16/3459 365/185.21 |
| 2020/0035273 A1* | 1/2020 | Morita | G11C 11/4076 |

* cited by examiner

*Primary Examiner* — Uyen Smet
(74) *Attorney, Agent, or Firm* — Vierra Magen Marcus LLP

(57) ABSTRACT

A sense amplifier architecture is presented that can reduce sensing times by being able to sense smaller voltage swings between an ON memory cell and an OFF memory cell. The sense amplifier includes a sensing capacitor that, on one side, is connectable to multiple bit lines and, on the other side, to a main sense amplifier section. The main section includes a latch formed of a pair of inverters that has an input connected to the capacitor and an output that is connected to the other side of the capacitor by a third inverter. To pre-charge the latch, the input and output nodes are shorted and then the capacitor is connected to discharge the capacitor through a selected memory cell based on whether it is ON or OFF. A programming data latch for each bit line can bias the bit line to either a program enable or program inhibit level.

20 Claims, 19 Drawing Sheets

SENSE AMPLIFIER ARCHITECTURE PROVIDING SMALL SWING VOLTAGE SENSING

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

DETAILED DESCRIPTION

Figure 1A:
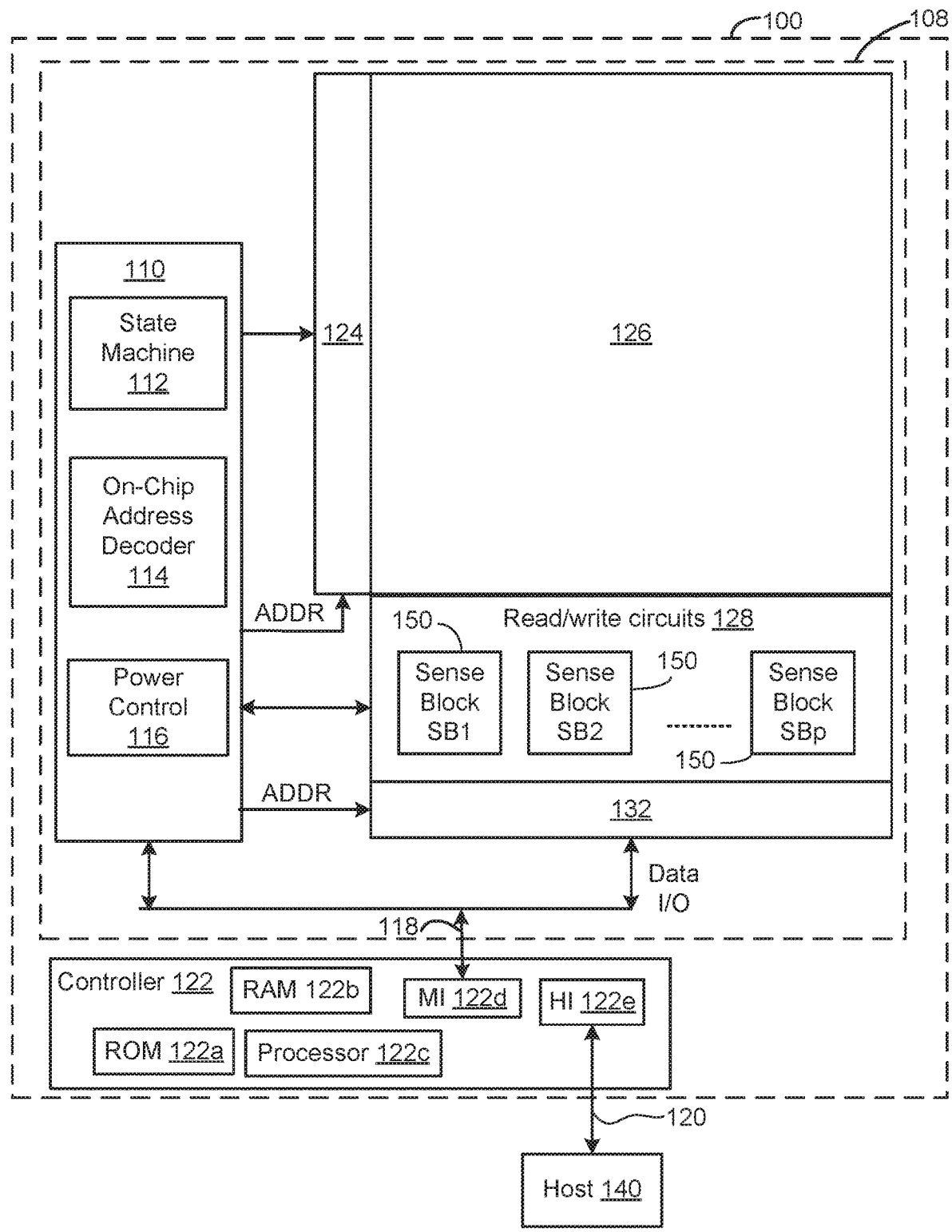
FIG. 1A is a functional block diagram of a memory device.

An important factor in the performance of a memory circuit is the speed with which memory cells can be sensed. Sensing operations are used both in data read operations and also in verify operations for writing data and erasing data. Consequently, any improvements in sensing times can significantly improve memory performance, particularly in multi-state memory devices where determining the data state of a memory cell can involve multiple sensing operations.

To improve memory performance, a sense amplifier architecture suitable for a memory circuit is presented that can reduce sensing times by being able to sense smaller voltage swings resulting from the difference between an ON memory cell and an OFF memory cell. A sensing capacitor is connected to an internal bit line that is connectable to each of one or more bit lines through a corresponding selection switch. On the other side of the sensing capacitor, a latch is connected. The latch includes a pair of inverters, a first of which has its input connected to the capacitor and the second of which has its input connected to the output of the first inverter of the latch. The output of the latch's second inverter is connected to the input of the first inverter of the latch. A node at the output of the first inverter latch/input of the second inverter latch can be connected to a data bus in order transfer read data out of the latch and transfer program data into the latch. The first inverter of the latch is configured to have a gain of more than unity so that a voltage level on its input is amplified, allowing a relatively small voltage swing on the internal bit line to be amplified and latched on the output node of the first inverter, which is also the output node of the latch. An additional, third inverter has its input connected to the output node of the latch and its output node connected to the internal bit line to feed back the output level on the latch back to the internal bit line.

In a sensing operation, whether for a data read or a verify, the internal bit line and the latch are pre-charged. In pre-charging the latch structure, the input of the latch is shorted to the output of the latch, such as by use of a switch connected between the input and output of latch's first inverter. After pre-charging, the internal bit is connected to a selected memory cell so that it can discharge at a rate based on the conductivity of the selected memory cell. After discharging for a sensing interval, the inverters can amplify the level of the resultant voltage swing on the internal bit line and amplify and latch this result.

The sense amplifier structure can also have a programming data latch associated with each of the bit lines connectable to the sense amplifier. In a write operation, write data for each of the bit lines can be sequentially transferred into the data latch of the main sense amplifier section, then transferred by way of the third inverter to the internal bit line, and from the internal bit line through a corresponding bit line select switch to the programming data latch of one of the bit lines associated with the sense amplifier. The write data in the associated bit line's programming data latch can then be used to bias the bit line to either a program enable or a program inhibit voltage level, after which a programming pulse can be applied to a word line for the selected memory cells.

FIGS. 1A-5 describe examples of memory systems that can be used to implement the technology proposed herein. FIG. 1A is a functional block diagram of an example memory system 100. In one embodiment, the components depicted in FIG. 1A are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The row decoder 124 can include the drivers and other elements to bias the word lines for the different memory operations. The read/write circuits 128 include multiple sense blocks 150 including SB1, SB2, . . . , SBp (sensing circuitry) and allow a page of memory cells to be read or programmed in parallel, where a page is the unit in which data is written and/or read. A physical page is the physical unit of a number of cells into which data can be concurrently written and/or read, and a logical page a corresponding logical unit of data written into a physical page. More detail on sense amplifier circuits that can be used in the sense blocks 150 including SB1, SB2, . . . , SBp is given below.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, and others) on memory structure 126, and includes a state machine 112, an on-chip address decoder 114, and a power control circuit 116. The state machine 112 provides die-level control of memory operations. In one embodiment, state machine 112 is programmable by software. In other embodiments, state machine 112 does not use software and is completely implemented in hardware (e.g., electrical circuits). In other embodiments, state machine 112 can be replaced by a programmable microcontroller. Control circuitry 110 also includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. Power control module 116 may include charge pumps for creating voltages. The sense blocks include bit line drivers.

Figure 2:
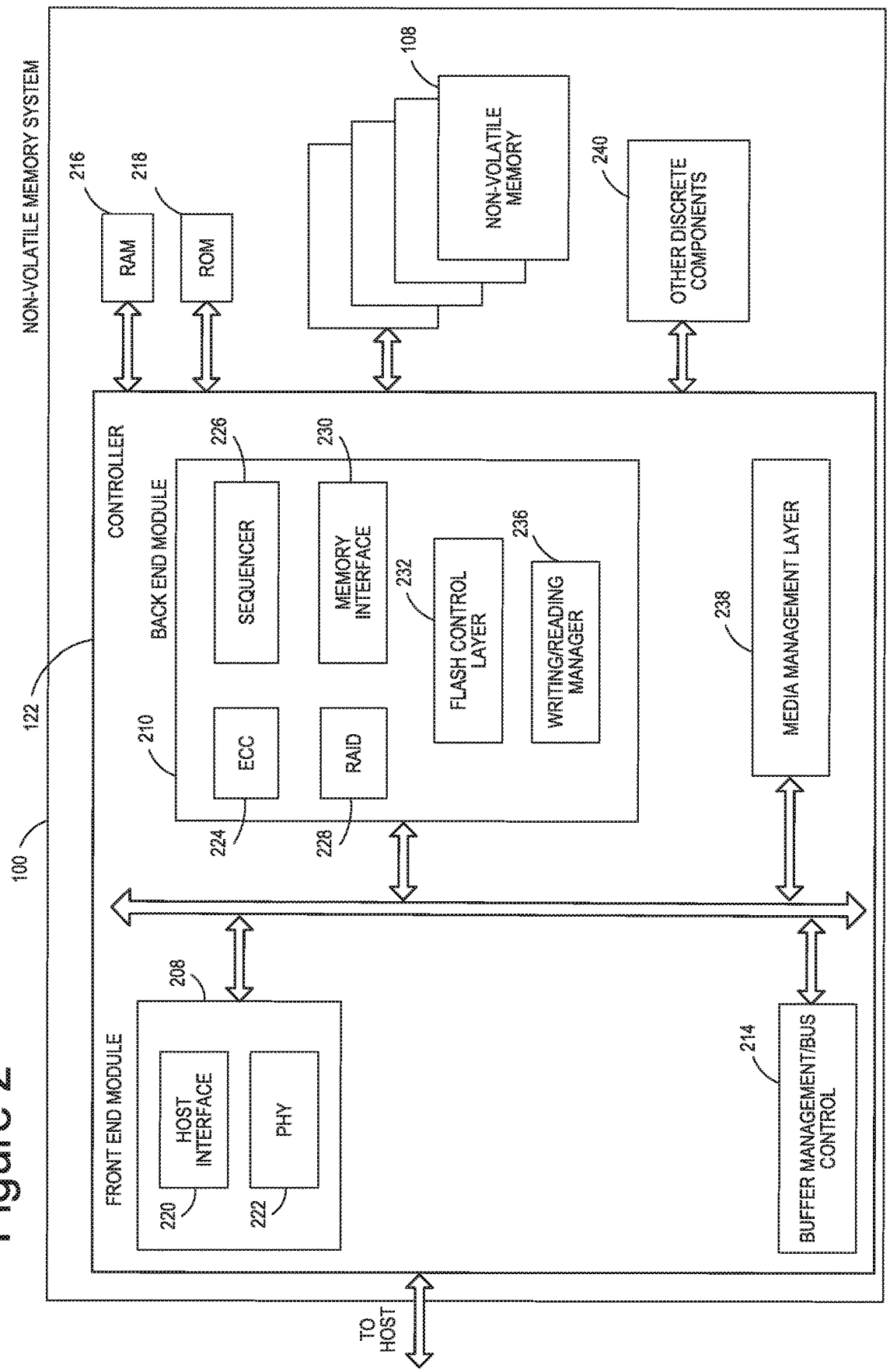
FIG. 2 is a block diagram depicting one embodiment of a memory system.

State machine 112 and/or controller 122 (or equivalently functioned circuits), in combination with all or a subset of the other circuits depicted in FIG. 2, can be considered part of the control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively, or additionally, one or more processors 122c can access code from a storage device in the memory structure, such as a reserved area of memory cells connected to one or more word lines. RAM 122b can be to store data for controller 122, including caching program data. Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 126 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other embodiments, the memory cells of a PCM memory can have their data state set or reset through use of current pulses. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 1B:
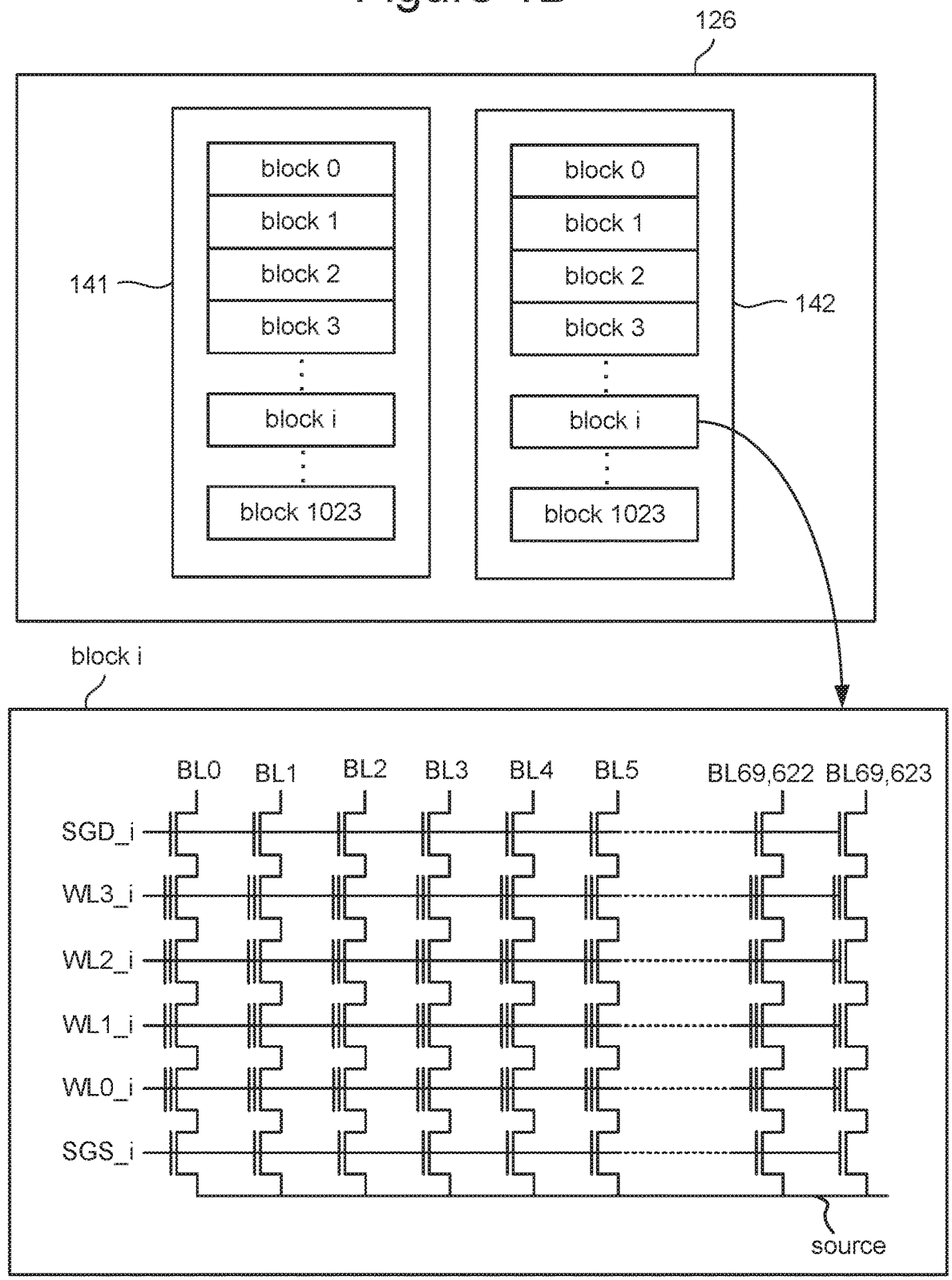
FIG. 1B is a block diagram depicting one example of a memory structure.

FIG. 1B depicts an example of memory structure 126. In one embodiment, an array of memory cells is divided into multiple planes. In the example of FIG. 1B, memory structure 126 is divided into two planes: plane 141 and plane 142. In other embodiments, more or less than two planes can be used. In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines; for example, erase block i of FIG. 1B includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 1B shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 1B shows 69,624 bit lines, a different number of bit lines can also be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data into the memory structure 126. For example, in one embodiment, the memory storage unit is a page sized to hold 4 KB of data. In certain embodiments, a complete memory storage unit is sized to match the number of physical memory cells across a row of the memory structure 126. In one embodiment, an incomplete memory storage unit has fewer physical memory cells than a complete memory storage unit.

FIG. 2 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid-state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front-end module 208 that interfaces with a host, a back-end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1A (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A Redundant Array of Independent Dies (RAID) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a writing/reading manager 236, which can be used to manage (in conjunction with the circuits on the memory die) the writing and reading of memory cells. In some embodiments, writing/reading manager 236 performs the processes depicted in the flowcharts described below.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126 of die 108. The MML 238 may be needed because: 1) the memory may have limited endurance; 2) the memory structure 126 may only be written in multiples of pages; and/or 3) the memory structure 126 may not be written unless it is erased as a block. The MML 238 understands these potential limitations of the memory structure 126 which may not be visible to the host. Accordingly, the MML 238 attempts to translate the writes from host into writes into the memory structure 126. Erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid-state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
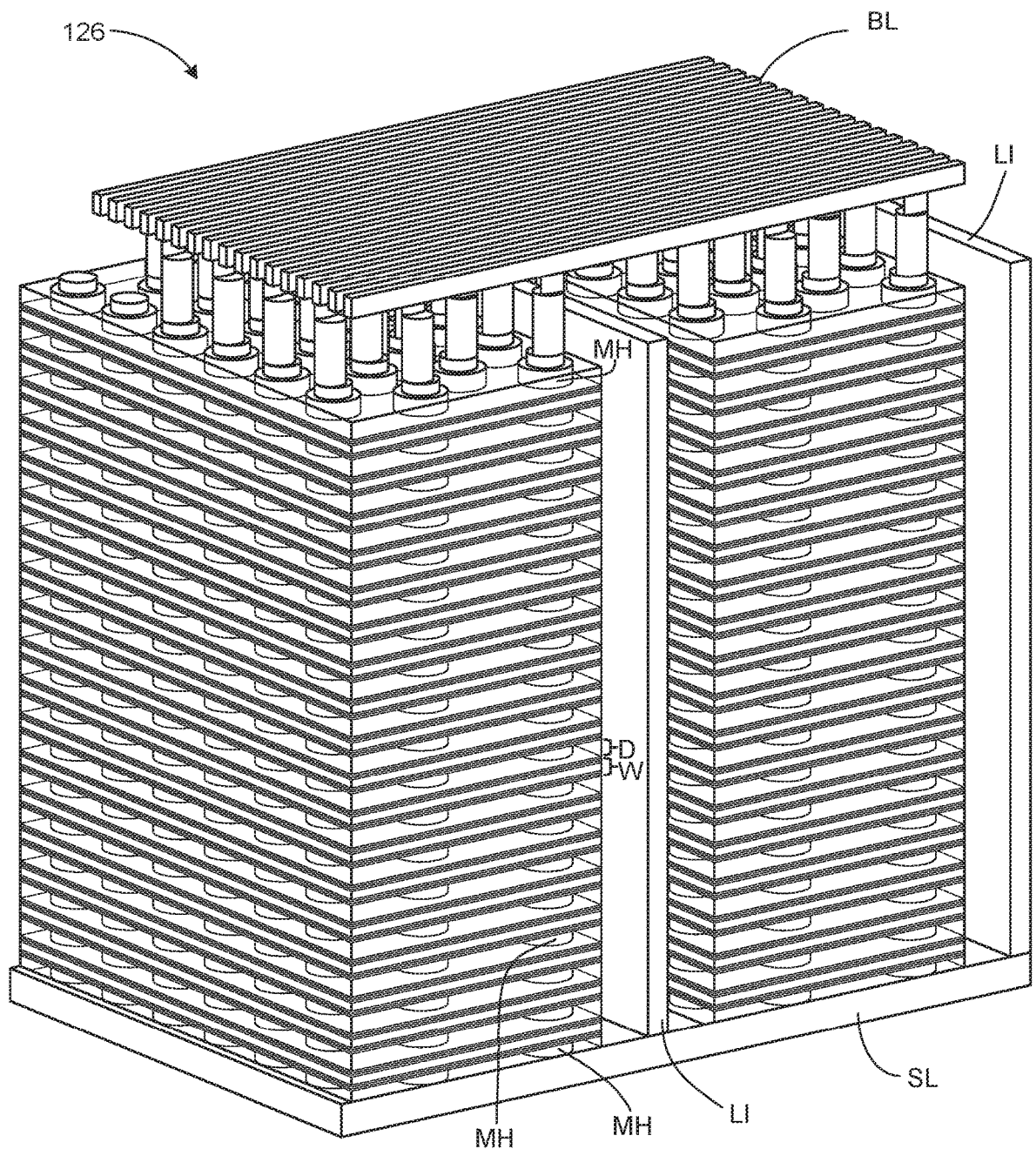
FIG. 3 is a perspective view of a portion of one embodiment of a monolithic three-dimensional memory structure.

FIG. 3 is a perspective view of a portion of one example embodiment of a monolithic three-dimensional memory structure 126, which includes a plurality memory cells. For example, FIG. 3 shows a portion of one block of memory. The structure depicted includes a set of bit lines BL positioned above a stack of alternating dielectric layers and conductive layers. For exemplary purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI (isolation areas). FIG. 3 only shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory structure 126 is provided with respect to FIG. 4.

Figure 4:
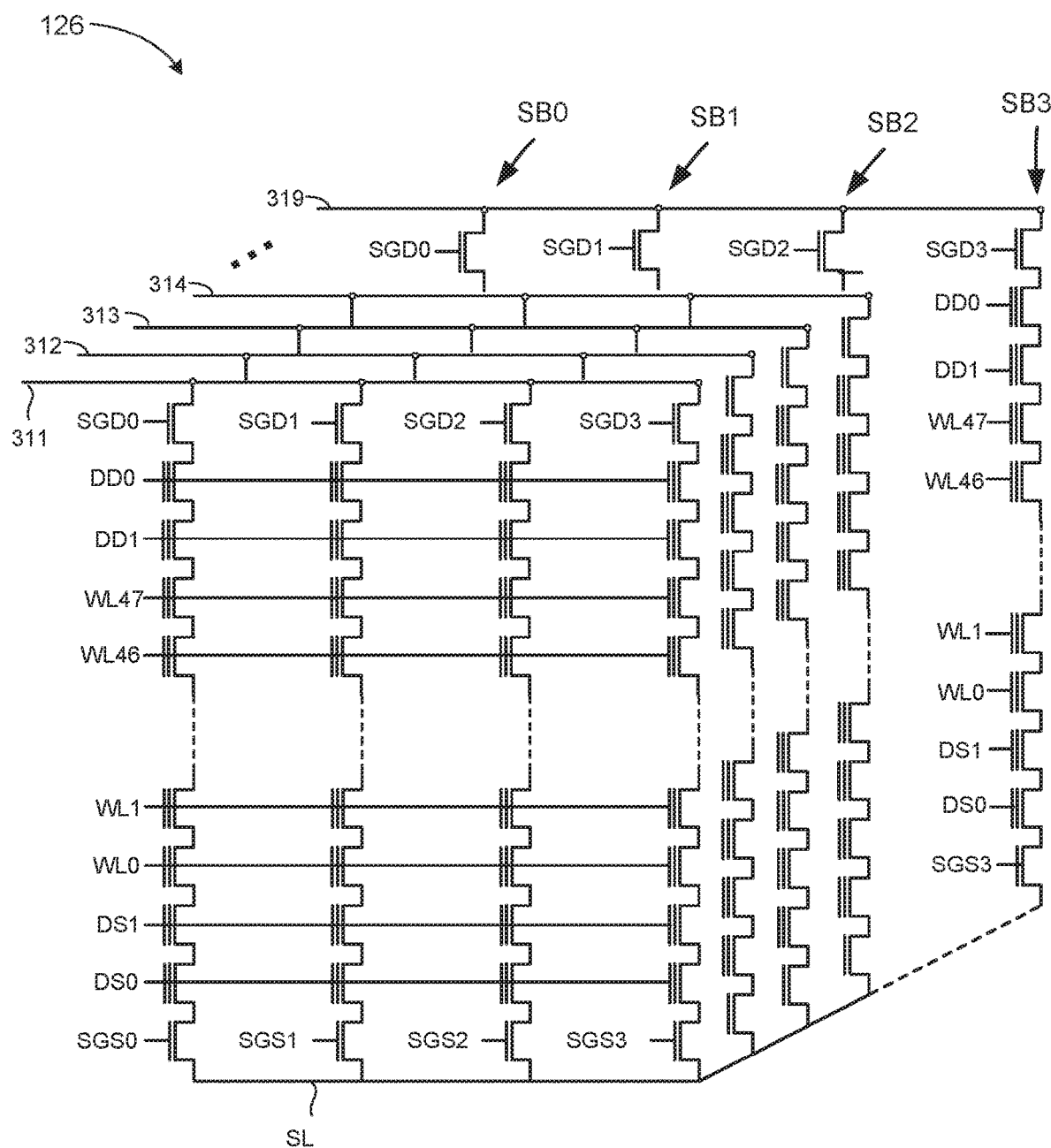
FIG. 4 is a schematic of a plurality of NAND strings.

FIG. 4 depicts an example 3D NAND structure and shows physical word lines WLL0-WLL47 running across the entire block. The structure of FIG. 4 can correspond to a portion of one of the blocks of FIG. 1B, including bit lines 311, 312, 313, 314, . . . , 319. Within the block, each bit line is connected to four NAND strings. Drain side selection lines SGD0, SGD1, SGD2 and SGD3 are used to determine which of the four NAND strings connect to the associated bit line. The block can also be thought of as being divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Figure 5:
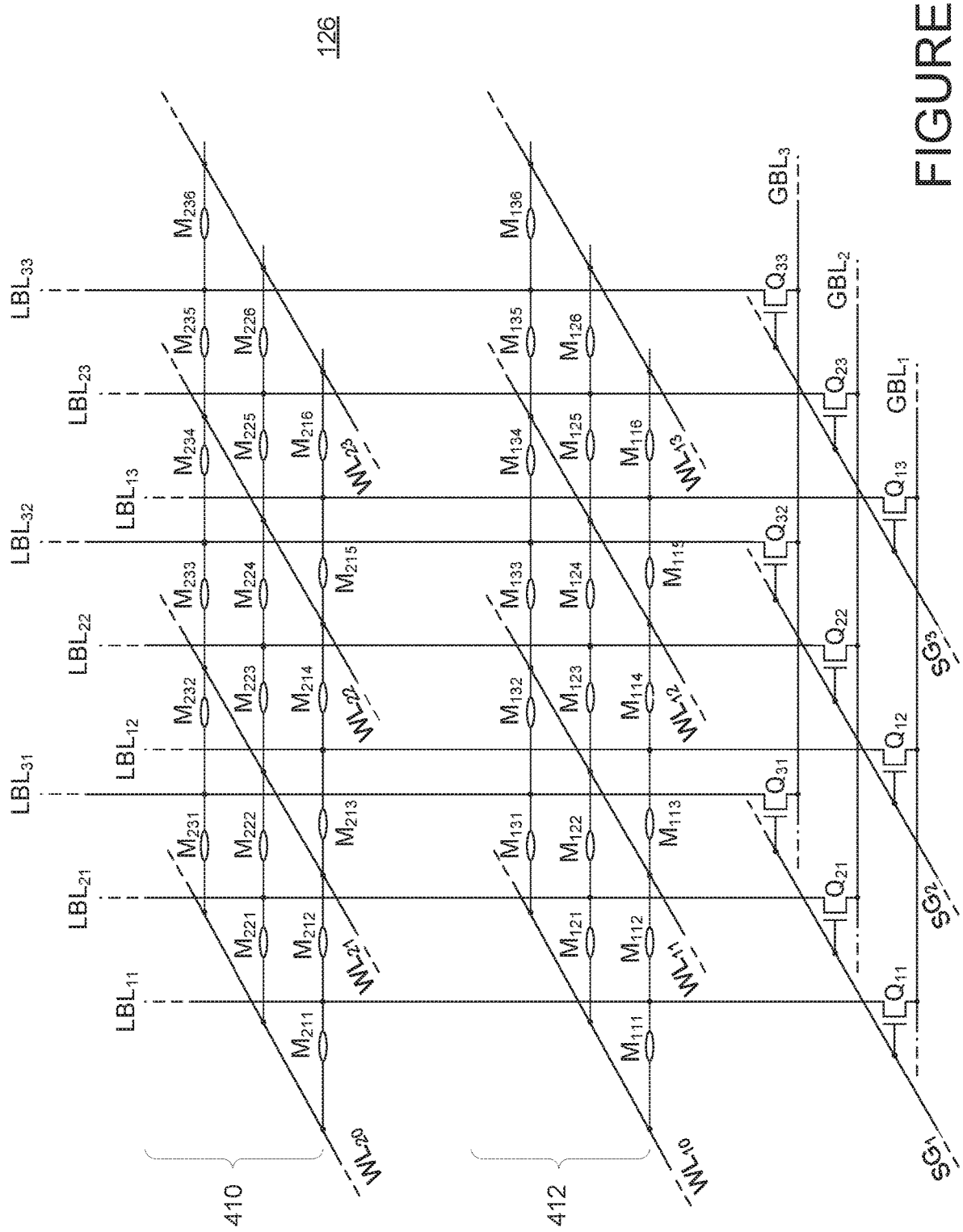
FIG. 5 depicts various embodiments of a portion of a three-dimensional memory array with a vertical cross-point structure.

FIG. 5 illustrates another memory structure that can be used for the structure 126 of FIG. 1A. FIG. 5 illustrates a three-dimensional vertical cross-point structure, the word lines still run horizontally, with the bit lines oriented to run in a vertical direction.

FIG. 5 depicts one embodiment of a portion of a monolithic three-dimensional memory array structure 126 that includes a first memory level 412 positioned below a second memory level 410. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory (PCM) material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$), such as a vertical thin film transistor (VTFT), may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 5, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

Figure 6:
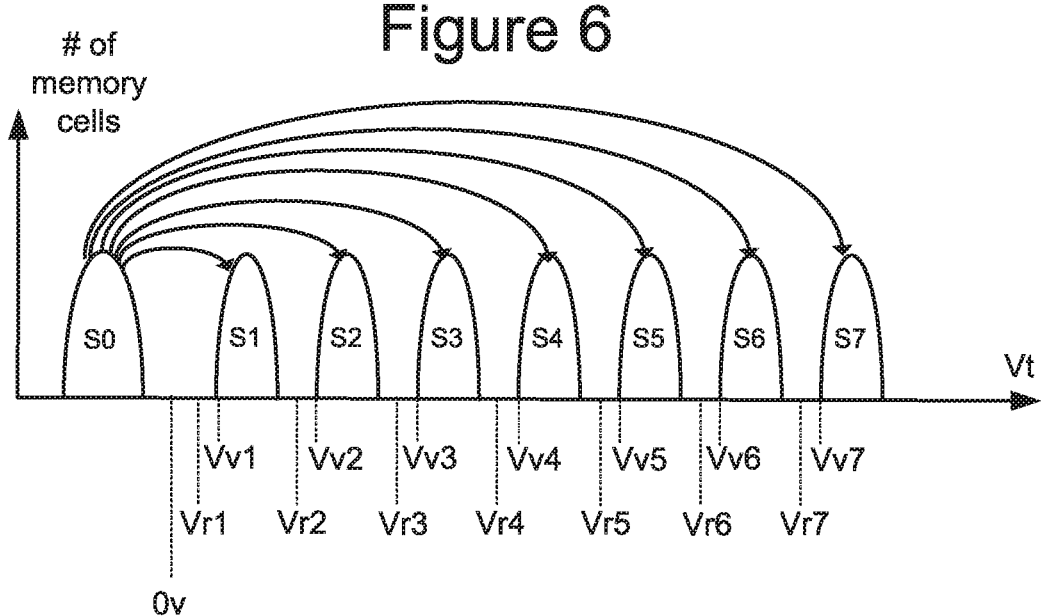
FIG. 6 depicts threshold voltage distributions in a three-bit per cell embodiment.

The memory systems discussed above can be erased, programmed/written and read. At the end of a successful programming process, the threshold voltages of the memory cells should be within one or more distributions of threshold voltages for programmed memory cells or within a distribution of threshold voltages (Vts) for erased memory cells, as appropriate. FIG. 6 illustrates example threshold voltage distributions for the memory cell array when each memory cell stores more than one bit of data in a multi-level cell (MLC) format, in this case three bits of data. Other embodiments, however, may use other data capacities per memory cell (e.g., such as one, two, four, or five bits of data per memory cell). FIG. 6 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 6 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

Figure 7A:
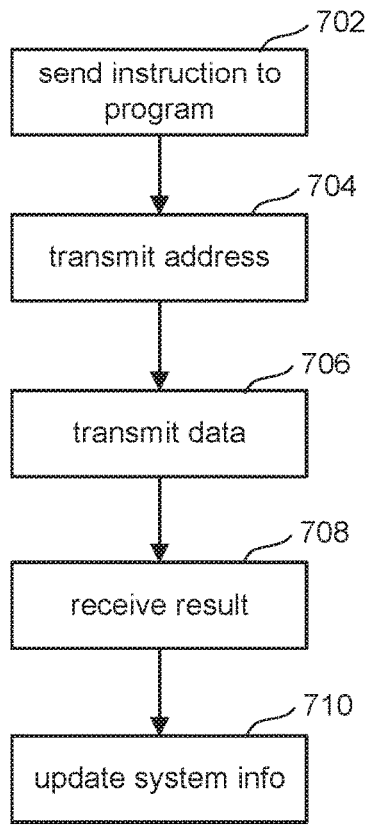
FIG. 7A is a flowchart describing one embodiment of a process for programming/writing.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art. These code words are the data transmitted in step 706. Controller 122 (e.g., writing/reading manager 236) can also scramble the data prior to programming the data in the memory.

Figure 7B:
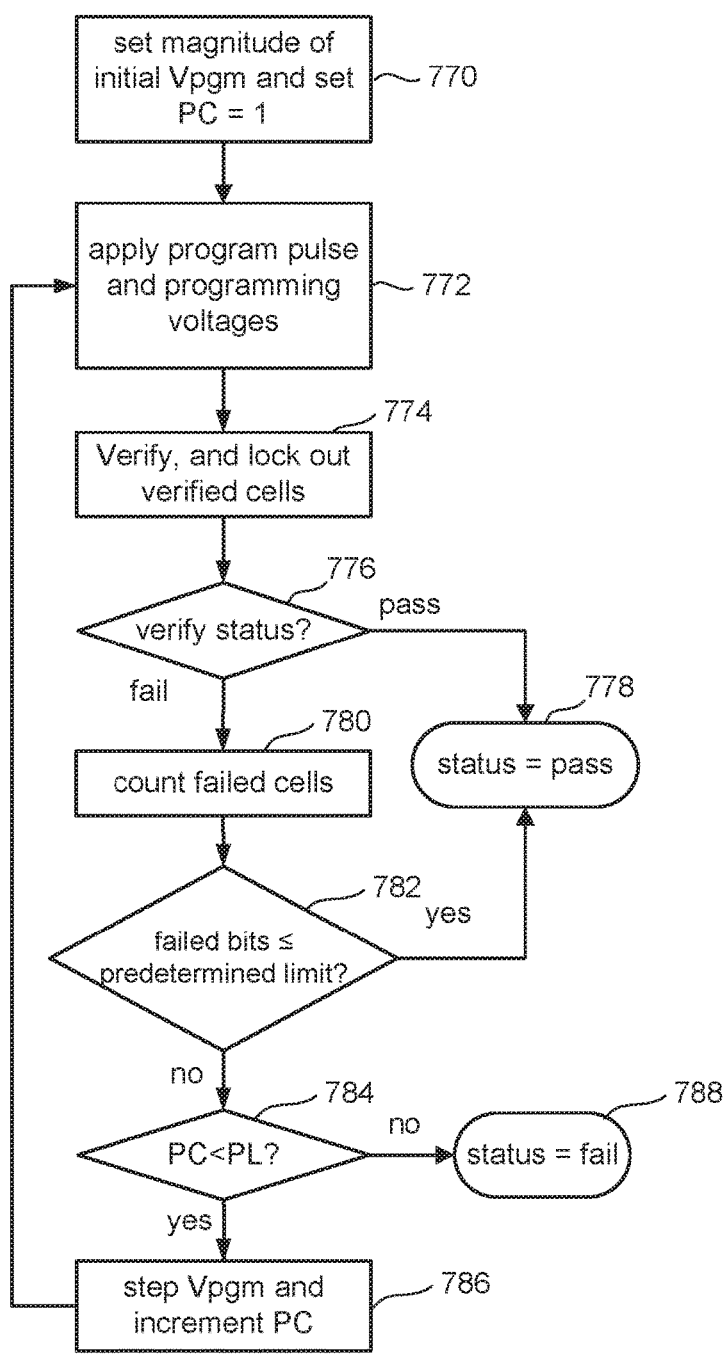
FIG. 7B is a flowchart describing one embodiment of a process for programming/writing data into memory cells connected to a common word line.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above (see FIG. 1), at the direction of state machine 112. The process of FIG. 7B can also be used to implement the full sequence programming discussed above. The process of FIG. 7B can also be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, then the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, then the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), word line units, blocks, jumbo blocks, or other units.

Figure 7C:
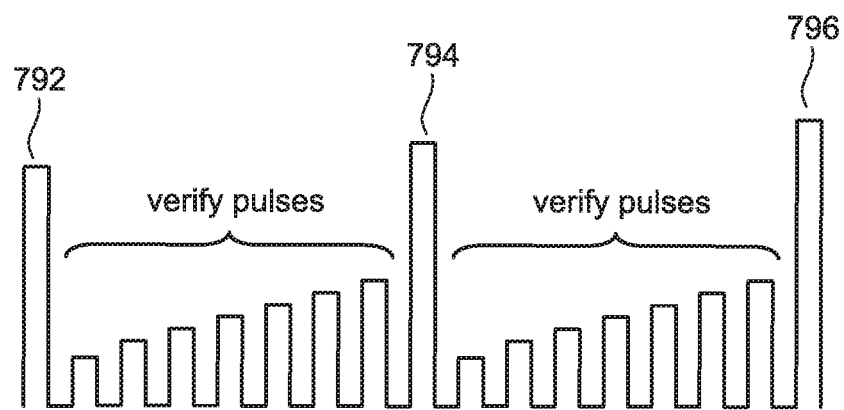
FIG. 7C depicts a word line voltage during programming/writing and verify operations.

Step 772 of FIG. 7B includes applying a program voltage pulse on the selected word line. Step 774 of FIG. 7B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

Figure 8:
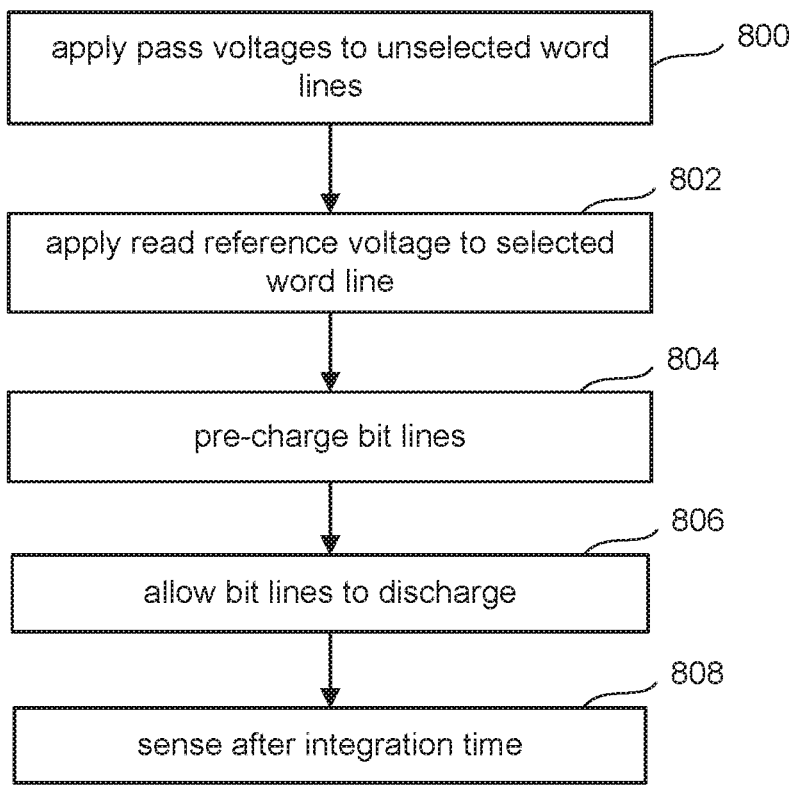
FIG. 8 is a flowchart describing one embodiment of a process for reading data from non-volatile memory cells.

FIG. 8 is a flowchart describing a sensing operation performed in order to read data from the memory cells. In step 800, a pass voltage is applied to unselected word lines so that unselected memory cells on a NAND string are conducting, which enables the system to test whether the selected memory cell conducts in response to the read reference voltage. This pass voltage is often referred to as Vread. In step 802, the appropriate read reference voltage, also referred to as Vcgr, is applied to the selected word line. In one example of a system that stores one bit per memory cell, Vcgr=0 v, or a small voltage near 0 v. In step 804, all of the bit lines are pre-charged. In one example embodiment, the bit lines are pre-charged by charging a capacitor in a sense amplifier and then putting the bit line in communication with the charged capacitor so that the bit line charges up. In step 806, the bit line is allowed to discharge, for example, by discharging the capacitor. After a predetermined time period, referred to as the "integration time" or "strobe time" the voltage of the capacitor is sampled to see whether the respective memory cell(s) conducted in step 808. If the memory cell conducts in response to Vcgr, then the threshold voltage of the memory cell is less than Vcgr. If Vcgr=0 v and the memory cell turns on, then the memory cell is in the erased state and the data stored is 1. If Vcgr=0V and the memory cell does not turn on, then the memory cell is in the programmed state and the data stored is 0.

The sensing operation of the memory cells can be performed by sense amplifier circuits that can be part of the sense blocks 150 including SB1, SB2, . . . , SBp of FIG. 1. The following discussion looks at sense amplifier circuits in more detail and, more specifically, at sense amplifier architectures that can improve memory performance. As the amount of data that non-volatile memories can store increases, the performance requirements of the memory devices also increase. To meet market demand, there is an on-going effort to improve performance by reducing read times and program times. In typical sense amplifier designs, a major component of sensing times, both for data read and program or erase verify, are word line ramp up times, bit line ramp up times, and settling times, along with the sense times described in the flow of FIG. 8. The sense amplifier architectures of the embodiments presented here can lead reduced sensing times, specifically with respect to the final steps of FIG. 8.

Figure 9:
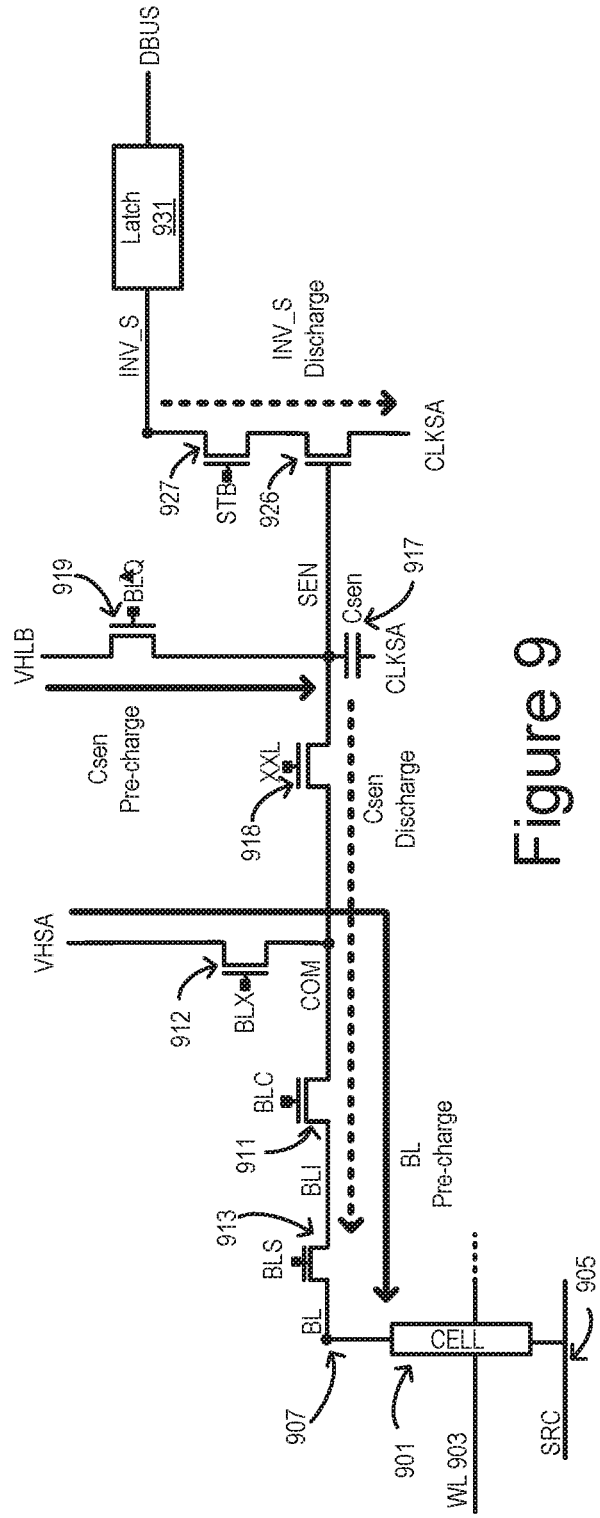
FIG. 9 illustrates an example of a sense amplifier architecture connected to a selected memory cell.
Figure 14:
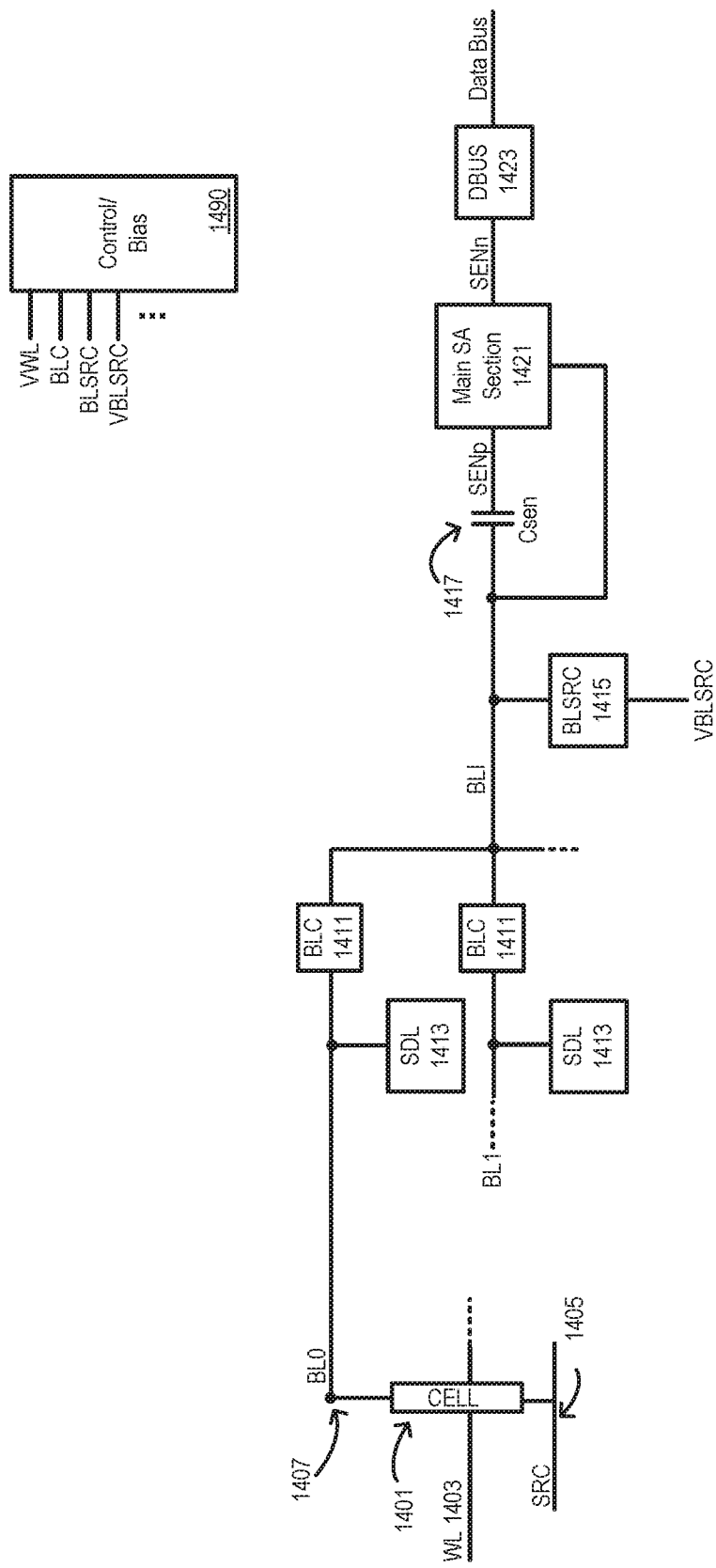
FIG. 14 is a high level block diagram of one embodiment of a sense amplifier architecture for determining the data state of a selected memory cell using small voltage swings between an ON memory cell and an OFF memory cell.

For comparison with the embodiments presented below beginning with FIG. 14, FIG. 9 presents a simplified representation of a current-based sense amplifier design that operates by discharging a sensing node or capacitor through a selected memory cell, and then using the resultant voltage on the sensing node to set the gate voltage on a transistor through which a node connected to a data latch is discharged.

More specifically, FIG. 9 illustrates an example of a sense amplifier architecture connected to a selected memory cell. A selected memory cell 901 is connected along a word line WL 903 and bit line BL 907, which is in turn connected to a bit line select switch BLS 913 on one end and a source line SRC 905 on the other end. The selected memory cell 901 can be from one of the various technologies described above. In the case of a NAND memory structure or other architectures where other control lines (such as for the select gates or the non-selected memory cells of a NAND string) require biasing for the sensing of a selected memory cell, these additional control lines are not represented in FIG. 9, but would be biased as needed for the sensing operations described in the following discussions. The bit line select switch 913 allows for one or more bit lines to be selectively connected to the internal bit line node BLI of the sense amplifier. (In the following, devices such as the transistor BLS 913 will frequently be referred to by the same name as the control signal applied to the device's gate.)

In the sense amplifier circuit of FIG. 9, the internal bit line node BLI is connected through the bit line clamp BLC 911 to the common node COM, which is in turn connected through the transistor XXL 918 to the sensing node SEN. A sensing capacitor Csen 917 is connected between the SEN node and a voltage level CLKSA. The COM node can be charged from a level VHSA by way of BLX 912 and the SEN node can be charged form a level VHLB by way of BLQ 919. The values of VHSA and VHLB will depend upon the particulars of the implementation and may be different or the same, where these will be high supply voltage levels for the sense amplifier and typically with a value on the order of a few volts. A transistor 926 is connected between the voltage level CLKSA and, through STB 927, to the node INV_S and has its control gate connected to the SEN node. A latch 931 is connected between the INV_S and a data bus. Only a single latch is shown, but in many cases a sense amplifier will be connected to multiple latches, such as in the case of multi-level memory cell operations. A typically implementation of a sense amplifier circuit will have a number of other elements related to sensing and other functions the sense amplifier may perform (such as biasing a bit line to a program enable or program inhibit level during a program operation), but these are not shown here to simply the figure and discussion.

Figure 10:
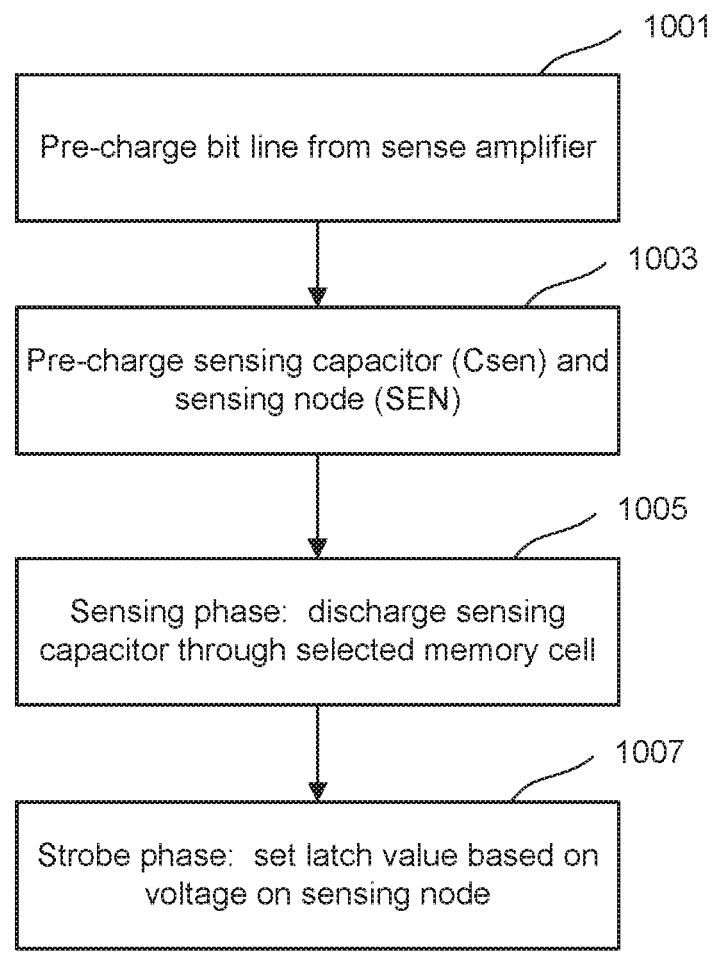
FIG. 10 is flowchart illustrating one embodiment for the operation of the sense amplifier circuit of FIG. 9 for a sensing operation.

FIG. 10 is flowchart illustrating one embodiment for the operation of the sense amplifier circuit of FIG. 9 during a sensing operation. At step 1001, the bit line 907 of a selected memory cell 901 is pre-charged by way of the internal bit line node BLI. The node BLI is pre-charged to VBLC-Vth voltage through the VHSA-BLX-BLC-BLI path as illustrated by the correspondingly labelled solid arrow in FIG. 9, where VBLC is the voltage applied to the gate of BLC 911 and Vth in this instance is threshold voltage of BLC 911. The gate of BLX 912 will receive a voltage VBLX that is higher than VBLC voltage to keep the transistor BLC 911 in saturation. The VBLX voltage will define the COM node's voltage, which will be VBLX-Vth, where in this instance Vth is threshold voltage of BLX 912.

In step 1003 the sensing capacitor Csen 917 and node SEN are pre-charged. Csen 917 is pre-charged through the VHLB-BLQ-Csen path as illustrated by the correspondingly labelled solid arrow in FIG. 9. The VHLB level can be the high voltage level for sense amplifier, so that Csen 917 can be charged up to a few volts, for example, with the specific value depending on the implementation. Steps 1001 and 1003 can be performed in either order or concurrently, but are before the following step 1005.

As part of the sensing process, whether for a data read or program verify, the selected memory cell 901 is biased as described above, such as with respect to step 800 of FIG. 8, by setting the voltage on the word line WL 903 to read voltage Vcgr, as well as biasing the other elements (e.g., non-selected word lines, select gates, source lines) as needed for the particular memory technology being used. For the example of NAND memory, a selected memory cell 901 will have either high resistance or low resistance based on the memory cell's state (either ON cell or OFF cell) for particular a Vcgr voltage relative to the data state of the memory cell.

The sensing phase is performed at step 1005. Subsequent to the pre-charge operations of steps 1001 and 1003 in which BL 907 and Csen 917 are pre-charged to their expected values, the CLKSA can be raised to increase the SEN node's voltage level. The Csen capacitor 917 is then discharged through the SEN-XXL-BLC-BL_I path by having XXL 918 and BLC 911 on. Based on the selected memory cell's state, the Csen capacitor 917 will either discharge or not discharge, as illustrated by the correspondingly labelled broken arrow of FIG. 9.

The sensing phase of step 1005 continues to discharge the SEN node voltage (in the case where the selected memory cell 901 is in an ON state) until it reaches the threshold voltage of the transistor 926. If the selected memory cell 901 is in a high resistance state, SEN will see little or no discharge and the SEN node will stay high. In a strobe operation at step 1007, the gate voltage of STB 927 goes high and, based on the voltage level on Csen 917/SEN node voltage, transistor 926 will either turn ON or turn OFF. Based on the state of transistor 926, the node INV_S will either have a high value for its voltage or be discharged through STB 927 and transistor 926 and have a low value. The result can then be latched into latch 931 and subsequently sent out on the data bus.

The read time for a memory cell mostly depends upon the time of the word line setup, bit line settling, the sense time of discharging the SEN node (step 1005) and strobe time (step 1007). In the sensing scheme illustrated with respect to FIGS. 9 and 10, the time allowed to discharge the Csen/SEN node should be long enough for a memory cell in the ON state to discharge the SEN node to less than threshold voltage of the NMOS transistor 926. In this way, when the strobe (taking the voltage on the gate of STB 927 high) is applied, the line INV_S will not discharge to a low voltage level if the selected memory cell is in an ON state. The rate at which Csen 917 and the SEN node discharge depends upon the current flowing though the selected memory cell. The time for discharging the SEN node enough to differentiate between an ON memory cell and an OFF memory cell, Tsen, can be expressed as:

$$Tsen=(\Delta Vsen*Csen)/Ion,$$

where: Ion is the current for an ON memory cell; ΔVsen is change in voltage required for the SEN node to discharge below the threshold voltage of NMOS 926; and in this equation Csen is the capacitance of the Csen 917.

Figure 11:
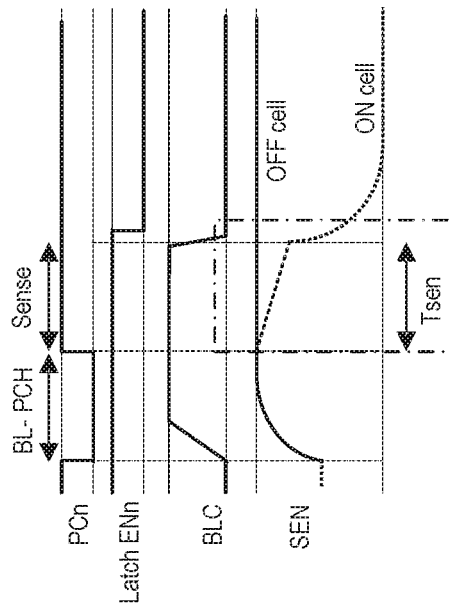
FIG. 11 is a set of waveforms illustrating some of the timings involved in the read process described with respect to FIGS. 9 and 10.

FIG. 11 is a set of waveforms illustrating some of the timings involved in the read process described with respect to FIGS. 9 and 10. On the top line is the inverse of the of the pre-charge enable signal PCn, which is low during the pre-charge phase and otherwise high. As illustrated above the PCn trace, PCn is low during the bit line pre-charge (BL-PCH) and SEN/Csen pre-charge and then subsequently high in the sense phase when SEN/Csen is discharged. During pre-charge, XXL 918 is off and, as represented by the solid arrows, BLX 912, BLC 911, and BLS 913 on are to pre-charge the bit line BL 907 and BLQ 919 is on to pre-charge the SEN node.

The inverse latch enable signal Latch_ENn is high until, after the strobe, it is lowered to latch the sensing result based on the level on INV_S. The third trace is the bit line select signal BLS, which is high for the duration of the time during which the selected memory cell is connected to the sense amplifier, including both the pre-charge phase and subsequent sensing phase until the level on INV_S is established. At bottom is the trace for SEN node.

The voltage level on the SEN node is raised during the pre-charge phase, where in this embodiment the bit line BL 907 and Csen 917 are pre-charged concurrently. If the selected memory cell is in an OFF state, the SEN node will not discharge during the sense phase and SEN stays high, as indicated by the solid trace, and the NMOS transistor 926 will be on for the subsequent strobe phase, allowing INV_S to discharge. If the selected memory cell is in an ON state, the SEN node will discharge during the sense phase, as indicated by the broken line trace, and the NMOS transistor 926 will be off for the subsequent strobe phase, preventing INV_S from discharging.

In FIG. 11, the time allotted for SEN to discharge in the sense phase is indicated Tsen and the combined sense and strobe phase are represented by the portion of the SEN trace enclosed in the box. As both data read operations and program verify operations require large numbers of such reads, memory performance can be improved if the sense and strobe intervals of a sensing operation can be reduced.

To be able to differentiate an OFF cell from an ON cell, the voltage difference at the sensing node needs be large enough for long enough for the sense amplifier to accurately distinguish between the two cases. The more quickly that a sufficient difference, or voltage swing, can be established, the more quickly that sensing operation can be performed. This can be illustrated with reference to FIGS. 12 and 13.

Figure 12:
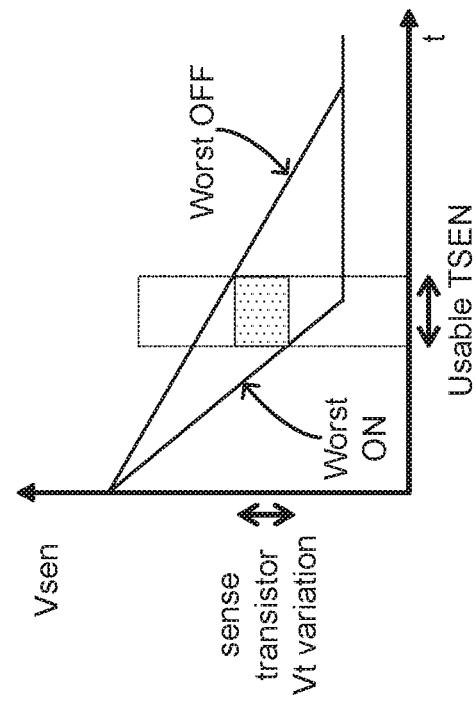
FIG. 12 is a sense margin graph to illustrate the voltage swing on the sensing node in the sense amplifier structure of FIG. 9.

FIG. 12 is a sense margin graph to illustrate the voltage swing on the sensing node in the sense amplifier structure of FIG. 9. In FIG. 12, the vertical axis presents the voltage $V_{SEN}$ on the sense node SEN that is connected to the control gate of the sensing transistor 926. For the sensing transistor to conduct, and be able to discharge the INV_S line, the voltage on the SEN node needs to be greater than the threshold voltage Vt of sensing transistor 926. However, due to processing and other variations between sense amplifiers, there will be a variation between the threshold voltages among the sensing transistors 926, as represented by the range illustrated in hatched region of FIG. 12. To reliably discharge INV_S, VSEN should be above this Vt variation range, and to reliably not discharge INV_S, VSEN should be below this Vt variation range.

As described above, during the sense phase of the current based sensing of an embodiment such as illustrated FIG. 9, for an ON memory cell, the current through the memory cell will discharge the SEN node along the path through XXL 918, BLC 911, and BLS 913. The more rapidly that the SEN node can be discharged below the Vt variation range, the sooner that the sensing phase can begin. However, again due to variations, ON memory cells will discharge at different rates, where FIG. 12 illustrates the discharge of a worst (i.e., low current when on) ON memory cell. For reliable sensing of an ON memory cell, the sense amplifier needs to wait until this worst ON voltage drops below the Vt variation range.

For an OFF memory cell, this will have little or no current through the memory cell so the SEN stays at the pre-charge level. In an actual circuit, many OFF memory cells will still allow some current, resulting in SEN discharging. This is illustrated in FIG. 12 for the worst (i.e., most current when off) OFF memory cell. For reliable sensing of an OFF cell, the sense amplifier should complete sensing before this worst OFF voltage drops enters the Vt variation range. The usable sense time Tsen, when worst ON is below, and worst OFF is above, the Vt variation range is as illustrated by the horizontal hatched region of FIG. 12. As illustrated by FIG. 12, the need to wait for the memory current to sufficiently discharge a worst ON memory cell limits the speed with which selected memory cells can be sensed.

Figure 13:
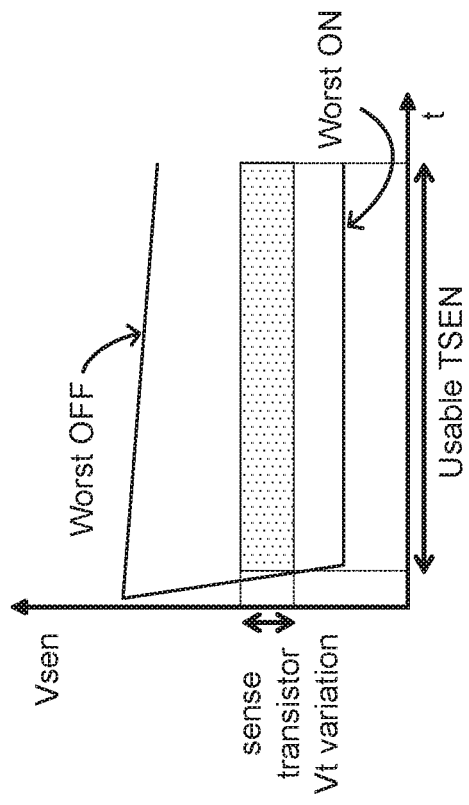
FIG. 13 is a sense margin graph to illustrate the voltage swing on a sensing node as in FIG. 12, but with a larger voltage swing.

To reduce sensing times, and consequently improve memory performance, if the voltage difference between an ON memory cell and an OFF memory cell, or voltage swing, on a sensing node can be made larger and more quickly stabilized, a sensing operation can begin more quickly and completed in a shorter time. In the arrangement of FIG. 9 if the current from the SEN node though BLC 911 can made larger, the voltage swing at the sensing node will be larger and more quickly established. FIG. 13 illustrates a large swing on the sensing node.

FIG. 13 is a sense margin graph to illustrate the voltage swing on a sensing node as in FIG. 12, but with a larger voltage swing. FIG. 13 repeats the elements of FIG. 12, but now the worst ON waveform drops much more rapidly, providing a much longer and earlier starting usable Tsen window, with the larger ON/OFF ratio resulting in a very wide sense margin. The gain available from a typical current-based sense amplifier is limited by the amount voltage swing, which can be a significant limitation for many applications. Given enough swing, the sense amplifier can amplify the on/off current ratio and widen sense margin. The minimum swing usable by the sense amplifier is limited by the current amplification property of BLC 911, which is in turn limited by BLC transistor's stability factor (or S-factor). Consequently, the current-based sense amplifier should a have a voltage swing comfortably larger than the S-factor of BLC 911. In some applications, this may limit the sensing speed of such current-based approach.

To overcome these possible limitations, the following introduces a voltage-based sense amplifier architecture that can provide sufficient gain even for smaller voltage swings. FIG. 14 is a high level block diagram of such a voltage based, small swing sense amplifier.

FIG. 14 is a high level block diagram of one embodiment of a sense amplifier architecture for determining the data state of a selected memory cell using small voltage swings between an ON memory cell and an OFF memory cell. Depending on the embodiment, the sense amplifier of FIG. 14 can be connected to one or more bit lines, where the example explicitly shows two bit lines BL0 and BL1. In following discussion, the example of four bit lines is used, where having multiple bit lines for each sense amplifier allows for bit lines selected for sensing to be separated by non-selected bits to reduce disturbs. Each of the bit lines is connectable to one or more memory cells, such as is illustrated BL0 1407 for memory cell 1401. As discussed above with respect to the corresponding elements of FIG. 9, the memory cell 1401 is connected between BL0 1407 and source line SRC 1405 and along word line 1403. As discussed above, the memory cell 1401 may be one of a group of memory cells, such as a NAND string, and word line 1403 can represent the corresponding set of control lines, such as select lines and word lines of non-selected memory cells along a NAND string.

The sense amplifier includes a sensing capacitor Csen 1417, to one plate of which is connected the internal bit line BLI. BLI is connected to a voltage level VBLSRC through switch BLSRC 1415. The internal bit line BLI is connectable to the one or more bit lines, each through a corresponding BLC switch 1411. The embodiment of FIG. 14 illustrates one corresponding BLC switch 1411 for each bit line, but in other embodiments a single BLC switch 1411 can be used with other bit line selection elements to allow one sense amplifier to be used with multiple bit lines. To allow concurrent programming of the multiple bit lines, each bit line has a corresponding SDL section 1413 on the other side of the BLC switch 1411. This allows for a program enable or program inhibit value to be latched in the SDL section 1413 for each bit line, while letting the bit lines share a common main section 1421 and sensing capacitor Csen 1417.

The other side of Csen 1417 is connected to a sensing node SENp that is in turn connected to the main sense amplifier (SA) section 1421. The main SA section 1421 is connected between SENp and SENn. SENn can in turn be connected to a data bus by way DBus switch 1423 to output the result of a sensing operation. The main SA section 1421 is also connected back across Csen 1417 to BLI.

The control signal switch BLSRC 1415, BLC switch 1411, and the other control signals used to bias the switches of FIG. 14-17, can be generated by one or more control circuits 1490. Depending on the embodiment, the one or more control circuits 1490 include electrical circuits to perform the operations described here and can be specific to a single sense amplifier, shared between multiple sense amplifiers, part of more general on-die control circuitry 110, or various combinations of these. The control circuits can include hardware only, or a combination of hardware and software (including firmware). For example, a controller programmed by firmware to perform the functions described herein is one example of a control circuit. A control circuit can include a processor, FGA, ASIC, integrated circuit or other type of circuit.

More specifically, referring back to FIG. 1A, the one or more control circuits of control/bias block 1490 of FIG. 14 can include control circuits within the sense blocks SB1, SB2, . . . , SBp (where the sense amplifiers can be located), along with elements of the on-die control circuitry 110 (including the state machine, on-chip address decoder 114, and power control 116). Other elements of the one or more control circuits can include row decoder 124, column decoder 132, and other elements of read/write circuits 128. For example, the various control signals applied to the sense amplifier of FIGS. 14-17 can be provided to logic and decoding circuitry in the sense blocks SB1, SB2, . . . , SBp based on instructions from the state machine 112 using voltage levels supplied by the power control 116. The biasing of the memory cell 1401, word line WL 1403, the source line SRC 1405, switch BLSRC 1415, BLC switch 1411 and other elements can be performed by control circuits including biasing circuitry, drivers, and decoders in with the row decoder 124, column decoder 132, and elements of read/write circuits 128, again based on instructions from the state machine 112 using voltage levels supplied by the power control 116.

Figure 15:
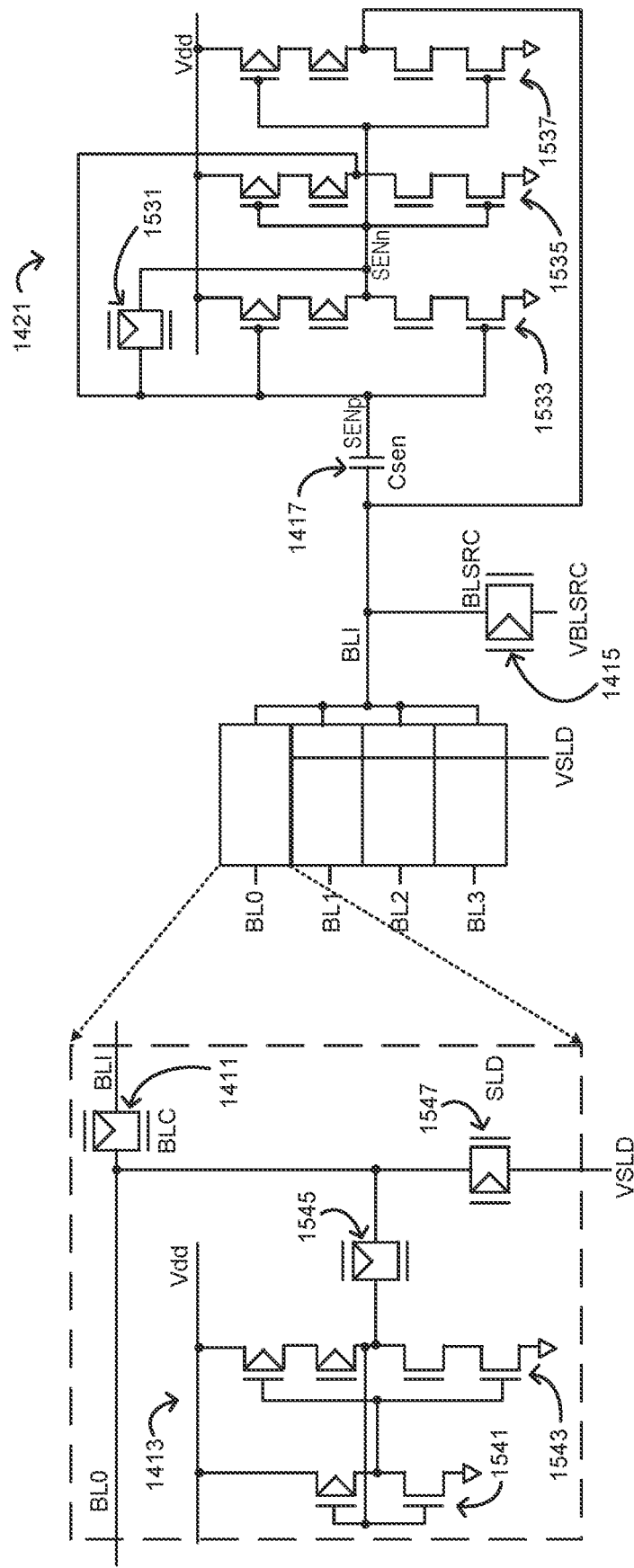
FIG. 15 is more detailed diagram of an embodiment of the sense amplifier of FIG. 14.

FIG. 15 is more detailed diagram of an embodiment of the sense amplifier of FIG. 14. In FIG. 15, and also in more detailed FIGS. 16 and 17, the memory cell 1401 and other memory array elements are not explicitly shown to simplify the presentation. Similarly, the control/bias block 1490 is not shown, but it will be understood that electrical circuits of control/bias block 1490 supply the various control signals for the elements described in FIG. 15-17. In the example of FIG. 15, the internal bit line BLI of a sense amplifier is connectable to four bit lines. For BL0, the SDL section 1413 is shown in more detail. The SDL section 1413 includes a pair of inverters 1541 and 1543 connected between crosscoupled to form a latch and having the input node of 1543 INV_S connected to bit line BL0 through a switch 1545. The bit line BL0 is also connected to a voltage level VSLD through a switch SLD 1547 that can be used to set the bit line to the VSLD level. In the shown embodiment, the switch 1545, SLD 1547, and BLC 1411 are implemented as transmission gates formed of a parallel connected NMOS, PMOS pair that have complementary control signals. In the example embodiments shown here, the switch BLSRC 1415 is similarly implemented as a transmission gate.

The main SA section 1421 in this embodiment includes three inverters 1533, 1535, and 1537 connected between a high supply level Vdd and ground. The inverter 1533 has its input connected to the sensing capacitor Csen 1417 at the SENp node and an output connected to the SENn node. The inverter 1535 is cross coupled with the inverter 1533, having its input connected to SENn and output connected to SENp, to form a latch. The inverter 1537 also has its input connected to the SENn node, but with its output connected across the sensing capacitor Csen 1413. A shorting switch EQ 1531 is connected between SENp and SENn, allowing the input SENp and output SENn of inverter 1533 to be shorted. The switch EQ 1531 is again implemented as a transmission switch of a parallel connected NMOS/PMOS pair receiving complimentary control signals.

Figure 16:
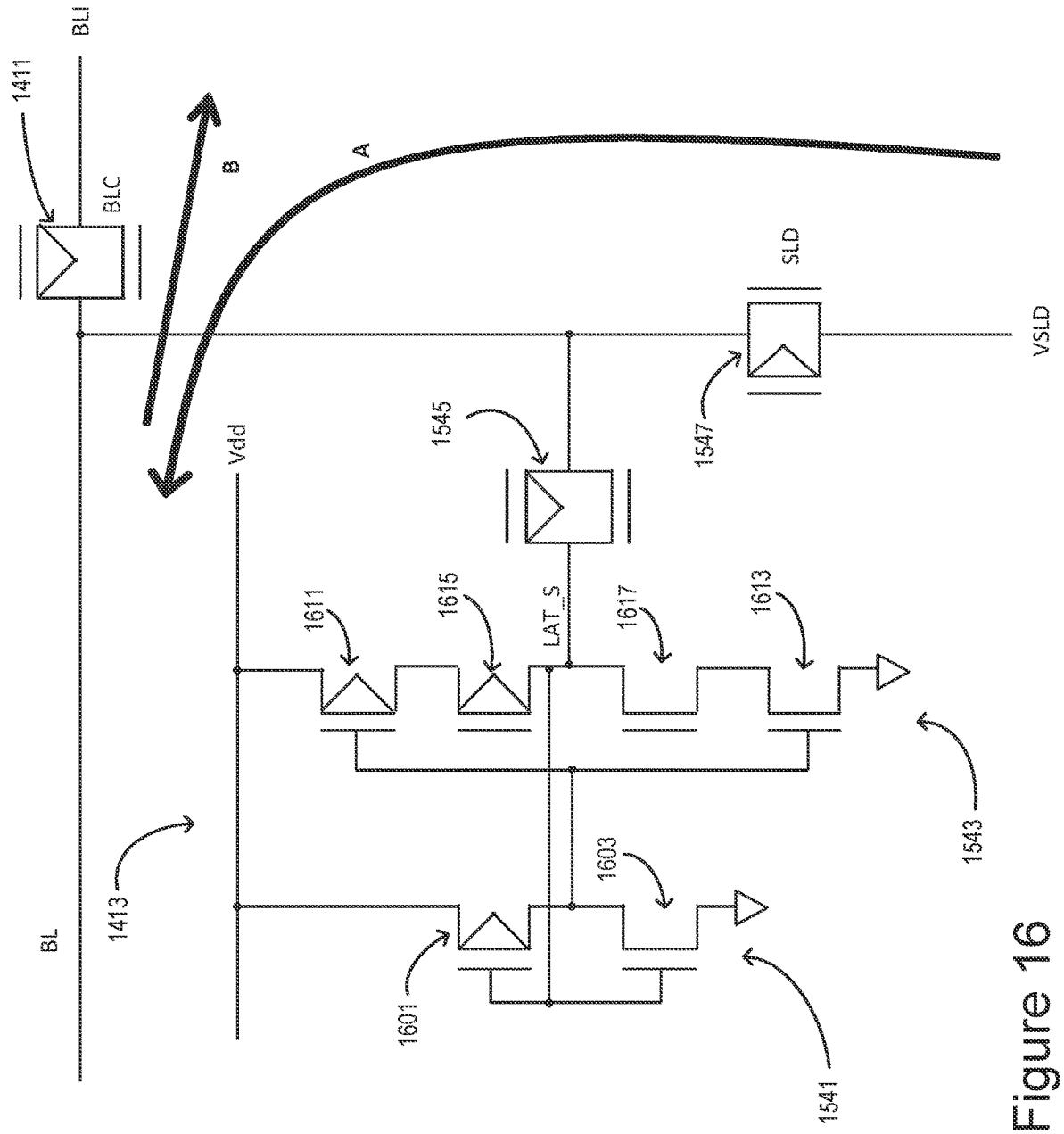
FIG. 16 provides additional detail on the SDL section of FIG. 15.

FIG. 16 provides additional detail on the SDL section 1413 of FIG. 15. The inverter 1541 is formed of the pair of PMOS 1601 and NMOS 1603, whose inputs are connected to INV_S. The output of the inverter 1541 is the input of PMOS 1611 and NMOS 1613 of inverter 1543, whose output is INV_S so that the inverters 1541 and 1543 can form a latch. A PMOS 1615 and NMOS 1617 can also be included to isolate the output of inverter 1543 from INV_S. The control signal for these transistors can be provided by the one or more control circuits of control/bias block 1490 as described above.

As illustrated by the arrow A, the transfer gate SLD 1547 can be used to provide a shielding voltage VSLD to the bit line BL when idle or when the bit line BL is unselected. When the switches 1545 and BLC 1411 are off, and SLD 1547 is on, this will set the bit line BL to be set the VSLD level, whether for shielding or for other purposes, such as pre-charging operations for the bit line.

The SDL section 1413 severs as a latch that can be used to the voltage on the bit line BL for programming operations. When switches 1545 and BLC 1411 off, and switch 1545 on, the bit line BL will be biased to the level on LAT_S. By latching a high voltage level on INV_S (e.g., Vdd), the bit line BL will be program inhibited, and by latching a low voltage level on INV_S (e.g., Vss), the bit line BL will be program enabled.

The switch of transfer gate BLC 1411 connects the bit line BL and SDL section 1413 to the internal bit line BLI as illustrated at arrow B and can be used for multiple purposes. Program data (program enable or program inhibit) can be transferred from BLI into the SDL section 1413 by the BLC 1411 and switch 1545 path. BLC 1411 can also be used to transfer pass/fail scan results between BL and BLI. The transfer gate BLC 1411 also connects the bit line BL, when selected, to BLI and the main SA section 1421 for sensing operations, whether for a data read, program verify, or erase verify.

Figure 17:
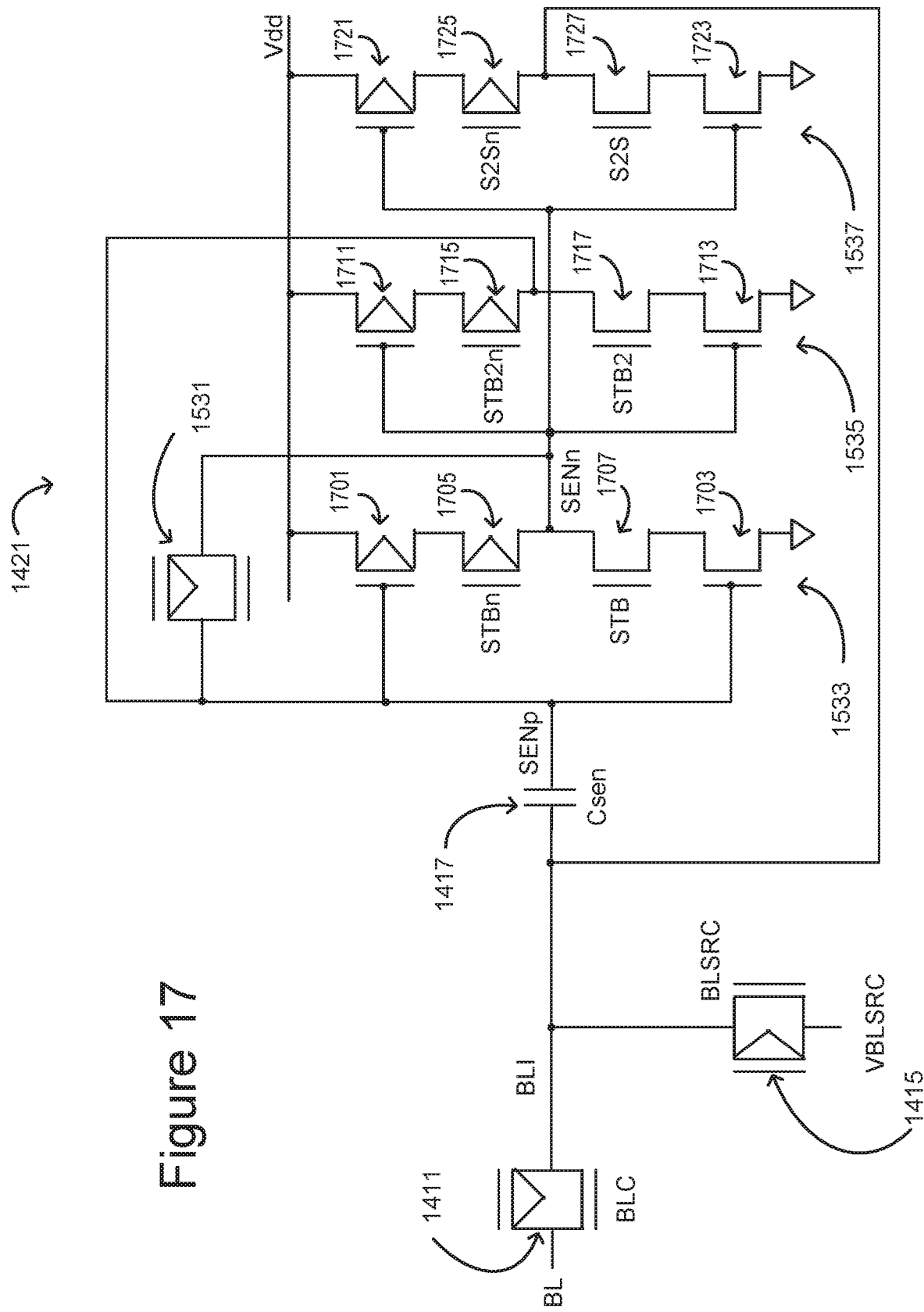
FIGS. 17-19 provide more detail on the main SA section of the sense amplifier structure of FIGS. 14 and 15 and its operation.
Figure 18:
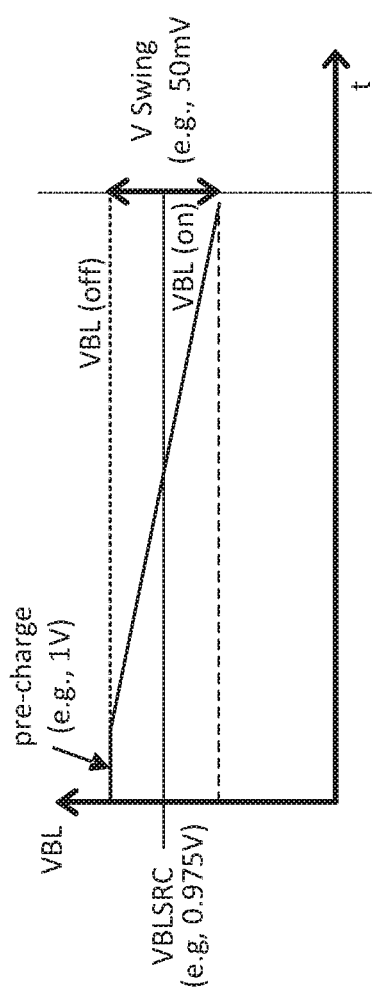
Figure 19:
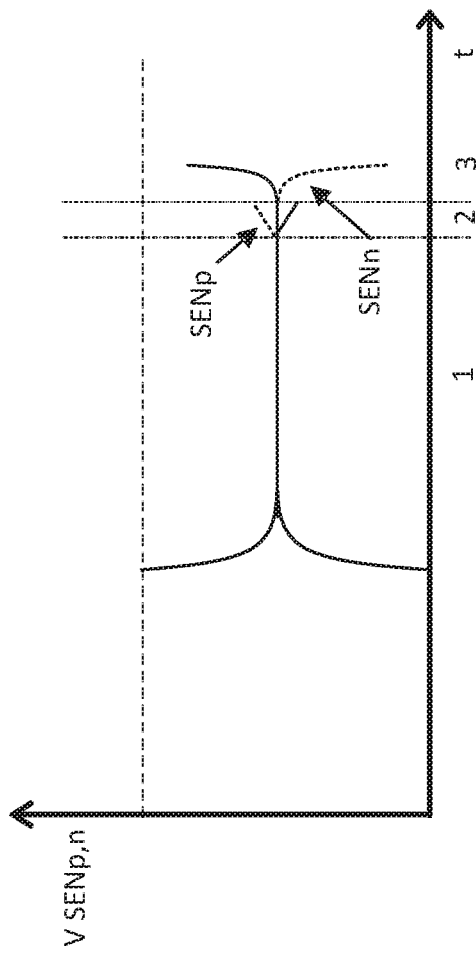

FIGS. 17-19 provide more detail on the main SA section 1421 of the sense amplifier structure of FIGS. 14 and 15 and its operation. The inverter 1533 includes the PMOS/NMOS combination of 1701/1703 connected in series between Vdd and ground, with their control gates connected to SENp and the node between them connected to SENn. The PMOS STBn 1705 is connected between PMOS 1701 and SENn, and the NMOS STB 1707 is connected between NMOS 1703 and SENn. The control signals STB and STBn are complementary and can be used isolate the inverter 1533 from the SENn node.

The inverter 1535 is arranged to form a latch with the inverter 1533, having its input connected to SENn and output connected to SENp. The inverter 1535 includes the PMOS/NMOS combination of 1711/1713 connected in series between Vdd and ground, with their control gates connected to SENn and the node between them connected to SENp. The PMOS STB2n 1715 is connected between PMOS 1711 and SENp, and the NMOS STB2 1717 is connected between NMOS 1713 and SENp. The control signals STB2 and STB2n are complementary and can be used isolate the inverter 1535 from the SENp node.

The inverter 1537 also has its input connected to SENn, but has its output connected across Csen 1417 to BLI. The inverter 1537 includes the PMOS/NMOS combination of 1721/1723 connected in series between Vdd and ground, with their control gates connected to SENn and the node between them connected to BLI. The PMOS S2Sn 1725 is connected between PMOS 1721 and the node connected to BLI, and the NMOS S2S 1727 is connected between NMOS 1723 and the node connected to BLI. The control signals S2S and S2Sn are complementary and can be used isolate the inverter 1537 from BLI. The control signal for the switches and transistors of FIG. 17 can be provided by the one or more control signals from the control/bias block 1490 as described above.

FIG. 18 illustrates the bit line voltage VBL during a sensing operation, whether for a data read or a verify. Initially, the bit line is pre-charged to, in this example, one volt, where the actual value may be higher or lower depending on implementation. Once the bit line is pre-charged and stabilized, the selected word line along the bit line is biased for a sensing operation. This can include applying a sensing voltage, such for reading or verifying a particular data state, to the corresponding word line, as well as any other needed memory cell array biasing, such as biasing select gates and non-selected memory cells of a selected NAND string to be ON. Depending on the relation of the sensing voltage to the data state stored in the selected memory cell, the memory cell will either be in an ON state and begin to discharge, or in an OFF state and maintain its pre-charge level. As illustrated in FIG. 18, as the sensing capacitor discharges (or not) during a sensing interval, this opens up voltage swing.

The sense amplifier architecture illustrated in FIG. 17 is able to distinguish between ON memory cells and OFF memory cells once a relatively small voltage swing, taken as 50 mV in this example, has opened up. The VBLSRC voltage level is taken to be intermediate to the VBL(off) and VBL(on) values at this time, or VBLSRC=0.975V in this example.

FIG. 19 looks at the voltage level on the SENp and SENn nodes over the same sensing process as shown for the bit line in FIG. 18. Initially, during the pre-charge and earlier discharge time for the bit line, SNEp and SENn may respectively be either high (e.g., Vdd) and low (e.g., Vss or ground) or low and high, depending the preceding operations of the sense amplifier. Before the bit line has had an opportunity to discharge sufficiently to fully establish the full voltage swing, such as some intermediate time after the bit line has begun (if ON) to discharge for some time, the SENn and SENp nodes are pre-charged during the interval marked as "1". To pre-charge SENn and SENp, STB 1707 and STBn 1705 are turned on, as is the shorting switch of transfer gate EQ 1531, so that the input SENp and output SENn of inverter 1533 are shorted, setting both SENp and SENn to an intermediate voltage level. During interval 1, BLSRC 1415 is on to set the voltage level on BLI, and the voltage on Csen 1417, as VBLSRC.

Once SENp and SENn are pre-charged and their voltage level settled, the switches BLSRC 1415 and EQ 1531 can be turned off. When the bit line voltage has had time to establish sufficient separation as illustrated by the voltage swing of FIG. 18, the transfer gate BLC 1411 is turned on and the internal bit line BLI is connected to the bit line of the selected memory cell. As illustrated on FIG. 19, this occurs at the transition for the interval 1 to the interval 2. For an ON memory cell, this will pull down BLI and SENp, and for an OFF memory cell, this will pull up BLI and SENp. At the transition from time interval 2 to time interval 3 STB/STNn 1707/1705 of inverter 1533 are on, and STB2/STN2n 1717/1715 of inverter 1535 and S2S/S2Sn 1727/1725 of inverter 1535 are turned on. This causes the inverted and amplified level voltage level on SENp to be latched on SENn, providing the voltage based sensing that can operate with the sort of low voltage swing illustrated in FIG. 18. The latched result on SENn can then be connected to the data bus by way of the DBus transfer gate 1423 to read out the sensing result.

The sense amplifier architecture illustrated with respect to FIGS. 14-19 can provide a constant gain independently of the voltage swing between the ON and OFF memory cell on the bit line, making the architecture suitable for fast operation. The use of the transfer gate EQ 1531 improves accuracy by cancelling threshold variations in the inverter 1541 that can come from process, voltage and temperature (PVT) variations. The architecture also allows for the use of very low voltage devices for its transistors since the use of a threshold dependent device for the sensing operation (such as the sensing transistor 916 of FIG. 9) have been eliminated.

Figure 20:
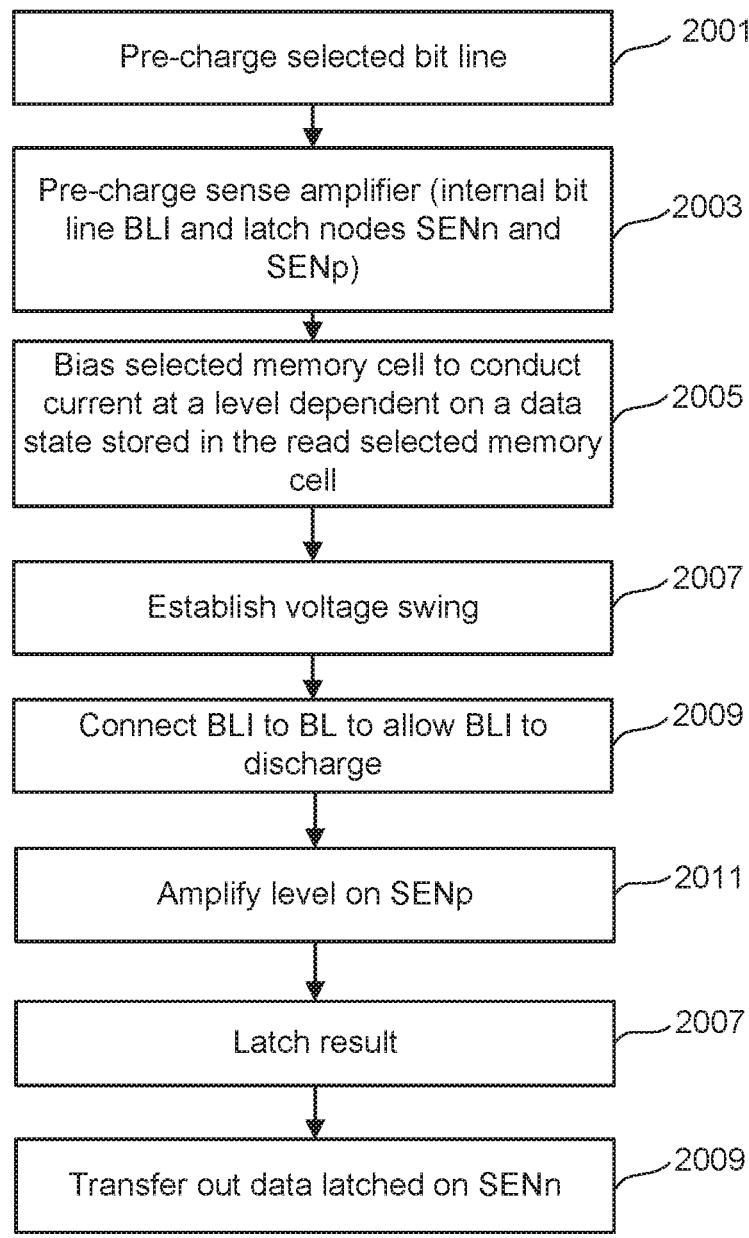
FIG. 20 is a flowchart of one embodiment of a sensing operation using the sense amplifier structure of FIGS. 14-19.

FIG. 20 is a flowchart of one embodiment of a sensing operation using the sense amplifier structure of FIGS. 14-19. At step 2001, the bit line of a selected memory cell, such as bit line BL0 1407 of selected memory cell 1401 of FIG. 14 is pre-charged. The selected bit line can be pre-charged by use of SDL 1547 based on control signals from the control/bias block 1490, establishing the bit line voltage VBL as illustrated at start of FIG. 18. The main SA section 1421 is pre-charged at step 2003, pre-charging BLI, SENn, and SENp by turning on STBn 1705, STB 1707, EQ 1531, and BLSRC 1415 based on control signals from the control/bias block 1490, as illustrated in period 1 of FIG. 19. Once pre-charged and stabilized, BLSRC 1415 and EQ 1531 can be turned off. At step 2005 the selected memory cell is biased to discharge, or not, depending on its conduction state by applying a sensing voltage to WL 1403 of selected memory cell 1401, as well as other needed array biasing (select gates, non-selected word lines, etc.). The control signal for these operation can again be based on control signal from block 1490, such as determined by the on on-chip control circuitry and with the voltages applied to the word line by drivers of row decoder 124. As illustrated by FIGS. 18 and 19, step 2005 can begin before the pre-charge of step 2003, but the pre-charge of BLI, SENn, SENp should completed prior to step 2009.

Step 2007 allows an interval for the bit line of the selected memory cell to discharge for an ON memory cell, as illustrated as in FIG. 18. Once a sufficient swing is established, at step 2009, the control circuitry 1490 turns on BLC 1411 to connect BLI to the bit line so SENp goes up or down depending on the VBL established in step 2007, as illustrated in period 2 of FIG. 19, where the solid down-sloping line of SENp is for an ON memory cell and the broken up-sloping line of SENp is for an OFF memory cell. At step 2011 STBn 1705, STB 1707, STB2n 1715, STB 1717, S2Sn 1725, and S2S 1727 are all on to amplify (and invert) with a gain of more than unity for the level on SENp and set the level on SENn, as illustrated in period, or interval, 3 of FIG. 19, where in interval 3 the solid up-sloping line of SENn is for an ON memory cell and the broken down-sloping line of SENn is for an ON memory cell. The result is then latched at step 2013 in the latch formed of inverters 1533 and 1535. The latched result can then be transferred out to a data bus from SENn by way of DBus switch 1423.

Figure 21:
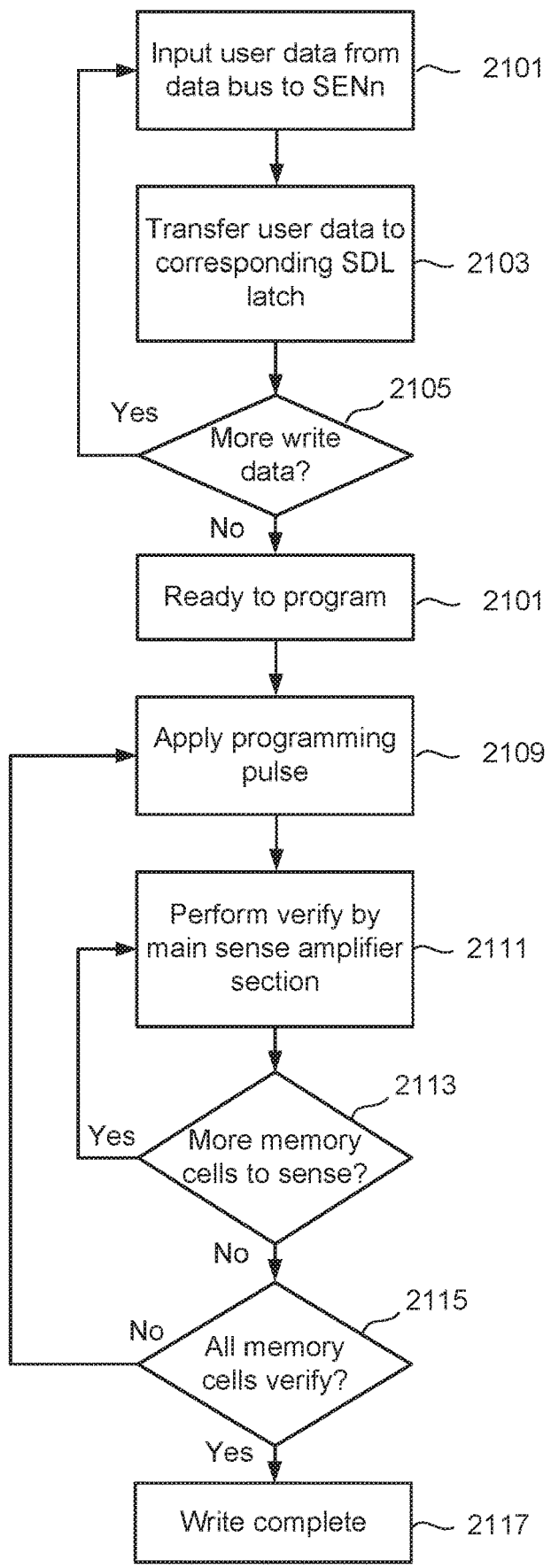
FIG. 21 is a flowchart of one embodiment for transferring and writing of data for a programming operation using the sense amplifier structure of FIGS. 14-19.

FIG. 21 is a flowchart of one embodiment for transferring and writing of data for a programming operation using the sense amplifier structure of FIGS. 14-19. Before data can be written, it will be transferred in from the data bus to each bit line's corresponding SDL section 1413 prior to programming, a process that can performed at the direction of state machine 112 and other elements in control/bias block 1490 that supply the control signals. At step 2101 user data to be programmed to a first bit line, such as BL 1407 FIG. 14 or, more generally, a bit line BLn, is transferred in from the data bus over the DBus transfer gate 1423 to SENn, where it can be latched into the SENn-SENp latch formed of inverters 1533 and 1535. As illustrated in the embodiments of FIGS. 14 and 15, each main SA section 1421 can be connected to multiple bit lines. The example embodiments have 4 bit lines, and corresponding SDL sections 1413, for each main SA section 1421. Prior to programming, such as by applying a programming pulse along a word line in the NAND memory embodiments described above, the write data for all of the bit lines along the word is transferred in.

At step 2103 the write data in the SENn-SENp latch formed of inverters 1533 and 1535 is transferred from SENn to BLI by inverter 1537, and from BLI to the bit line by way of transfer gate BLC 1411. The write data for the bit line is then latched in the corresponding SDL section 1413 for the bit line. The SENn node can then receive the next data for a bit line associated with the sense amplifier, which is similarly transferred to the bit line's corresponding SDL section 1413. This occurs at step 2105, with the flow looping back to step 2101 if there is more bit line write data to latch. In the example used here, this would be for the four bit lines associated with a sense amplifier. Once all of the write data has been loaded for the bit lines of a write page is loaded, the data is ready to program at step 2107. Although described here for a single sense amplifier and its corresponding set of bit line, the process can be performed concurrently for the other sense amplifiers and bit lines.

Figure 22:
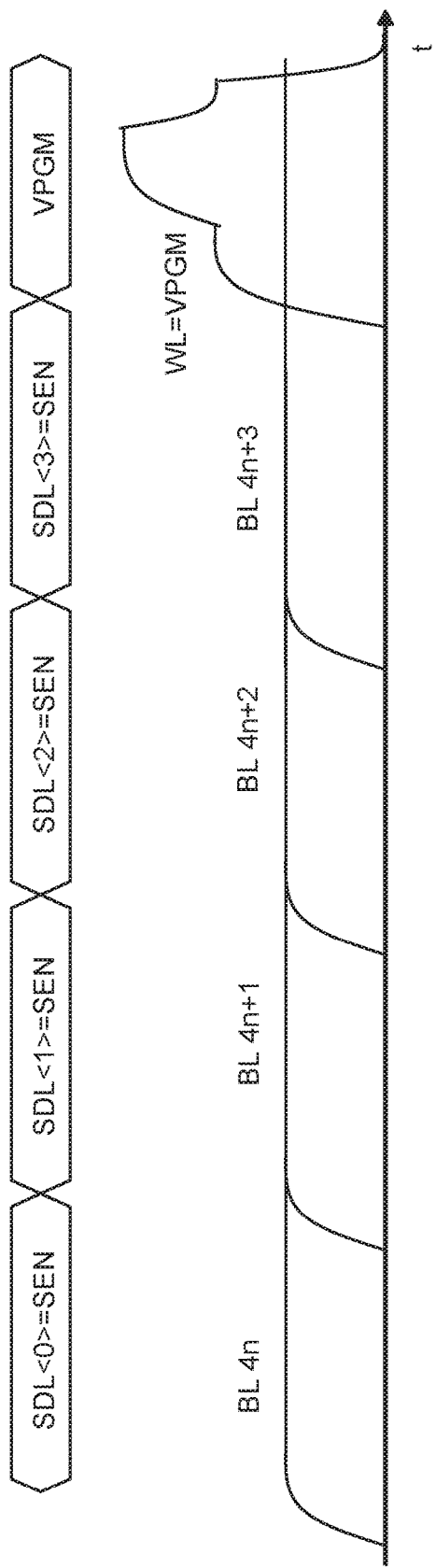
FIG. 22 is a set of waveforms illustrating the data transfer into the programming latches of the SDL sections.

FIG. 22 is a set of waveforms illustrating the data transfer into the programming latches of the SDL sections 1413, corresponding to steps 2101 to 2107 of FIG. 21. The example of FIG. 22 illustrates the process for a sense amplifier n with the corresponding set of bit lines BL 4n, BL 4n+1, BL 4n+2, and BL 4n+3. In this example, the sequential order starting with BL 4n is shown, but other embodiments can use other orders. Initial in FIG. 22, data is transferred in SENn of sense amplifier n, then by inverter 1537 to BLI and, by way of the corresponding BLC 1411, to BL 4n to be stored in the corresponding SDL section 1413, SDL<0>. The process is then repeated for BL 4n+1 and SDL<1>, BL 4n+2 and SDL<2>, and BL 4n+3 and SDL<3>. At this point, the write data is latched and the transfer gates BLC 1411 are all off. Any other biasing of the array needed for programming is established and a programming pulse VPGM can be applied along the corresponding word line, WL=VPGM. In the arrangement of FIGS. 14-19, as the SDL data latches are directly connected to the bit lines, they can control the program inhibit/program enable bit line biasing so that all of the bit lines can be programmed with user data simultaneously.

Returning to FIG. 21, at step 2109 the programming of the latched write data is performed, which can again be performed at the direction of state machine 112 and other elements in control/bias block 1490 that supply the control signals. For example, in the NAND memory structure described above, this corresponds to the application of a VPGM pulse to the selected word line WL 1403 of FIG. 14 from the drivers in the row decoder 124. As there are multiple bit lines, four in this example, connected to each sense amplifier, these bit lines are verified sequentially. In this example, this is done in the order BL 4n to BL 4n+3 for sense amplifier n, but other embodiments can use other orders. At step 2111, the selected memory cell along BL n is verified, where the verify operation can be as described above for a data read operation, but now the result is stored in the corresponding SDL section 1413. More specifically, if the SDL section was previously set to a program enable value and the memory cell verifies at step 2111 the value latched in the corresponding SDL section 1413 is changed to a program inhibit value. If there are more bit lines to be verified, at step 2113 the flow loops back to step 2111 for the next corresponding bit line; and if all of the corresponding bit lines have been verified, the flow moves from step 2113 to step 2115.

Step 2115 determines whether all of the selected memory cells along bit lines corresponding to a sense amplifier have verified. If not, the flow loops back to step 2109 for the next program pulse. If all of the memory cells verify as programmed at step 2115, the programming operation is complete for bit lines corresponding to the sense amplifier. The state machine 112 and other control and biasing elements of block 1490 can then move on to program any additional pages of data to be written, whether on the same word line (as in the case of multi-state memory cell embodiments) or on a different word line. FIG. 21 is simplified in a number of ways to illustrate the process where multiple bit lines and programming data latches (SDL section 1413) are associated with a single main SA section 1421. In an actual embodiment, there would typically be other such sense amplifiers and corresponding sets of bit lines operating concurrently in the write process and a write operation would continue until all (or a sufficient number) of the selected memory cells verify. The write operation can also include common program operation details such as have a maximum number of program loops before returning an error status or allowing some number of memory cells to fail to verify and dealing with these through error correction code (ECC) and other techniques.

Figure 23:
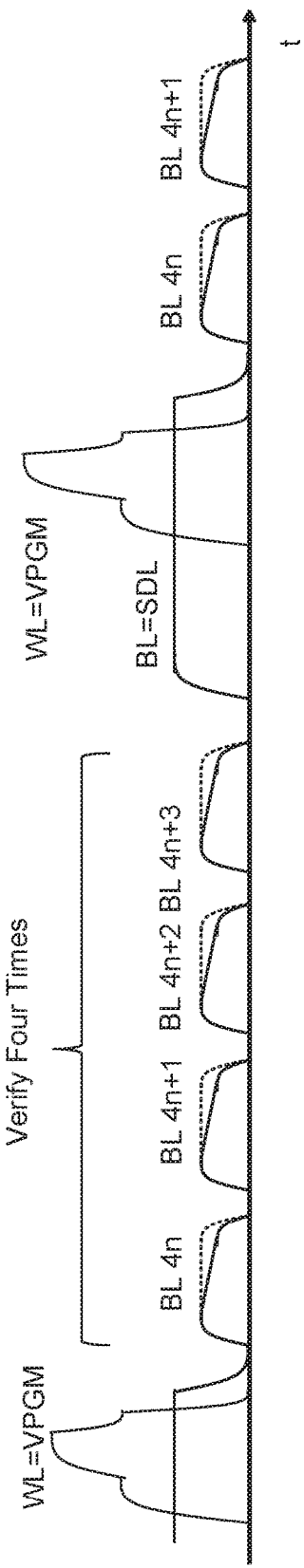
FIG. 23 is a set of waveforms illustrating an embodiment of a program verify operation.

FIG. 23 is a set of waveforms illustrating an embodiment of a program verify, corresponding to steps 2109 to 2115 of FIG. 21. Beginning at left, FIG. 23 picks up where FIG. 22 leaves off with a first programming pulse WL=VPGM once the write data has been loaded into the programming latches SDL sections 1413. The four (in this embodiment) bit lines BL n, BL n+1, BL n+2, and BL n+3 are then sequentially verified. FIG. 23 illustrates the bit line voltage on each of these bit lines during the verify operation and show the bit line being pre-charged, then an intermediate region corresponding to VBL of FIG. 18 (in which the bit line either maintains its pre-charge level for an OFF memory cell or discharges for an ON memory cell), after which the bit line is discharged and the process moves on to the next bit line. Once all of the set of bit lines have been verified and the results latched in the SDL section 1413, each of the bit lines can be biased to BL=SDL and the next programming approach pulse WL=VPGM is applied. The process repeats until all of the selected memory cells verify or the programming operation is otherwise terminated.

According to a first set of aspects, a sense amplifier circuit includes a capacitor having a first plate and a second plate, and a first selection switch configured to connect the first plate of the capacitor to a selected memory cell. A first inverter has an input node and an output node, the input node connected to the second plate of the capacitor. A second inverter has an input node connected to the output node of the first inverter, an output node connected to the input node of the first inverter, and is configured to form a latch with the first inverter. A shorting switch is configured to connect the input node of the first inverter to the output node of the first inverter, and a third inverter has an input node connected to the output node of the first inverter and an output node connected to the first plate of the capacitor. One or more control circuits are connected to the first selection switch, to the shorting switch, to the first inverter, to the second inverter and to the third inverters. The one or more control circuits are configured to: pre-charge the first plate of the capacitor and, concurrently with pre-charging the first plate of the capacitor, enable the shorting switch to connect the input node of the first inverter to the output node of the first inverter; and subsequent to pre-charging the first plate of the capacitor, disable the shorting switch, connect the first plate of the capacitor to the selected memory cell by the first selection switch, and discharge the first plate of the capacitor at a rate dependent upon a conduction state of the selected memory cell.

Other aspects include a method that includes pre-charging a sense amplifier circuit and biasing a read selected memory cell to conduct current at a level dependent on a data state stored in the read selected memory cell. Pre-charging the sense amplifier circuit, comprises: pre-charging an internal bit line connected to a first plate of a sensing capacitor of the sense amplifier circuit; and pre-charging a latch circuit of the sense amplifier circuit, the latch circuit including a first inverter having an input node connected to a second plate of the sensing capacitor and an output node connected to an input of a second inverter that has an output connected to the input of the first inverter, the sense amplifier circuit also including a third inverted having an input connected to the output node of the first inverter and an output connected to the internal bit line, and where pre-charging the latch circuit includes connecting the output node of the first inverter to the input node of the first inverter. Subsequent to pre-charging the sense amplifier circuit and while biasing the read selected memory cell to conduct current at a level dependent on a data state stored in the read selected memory cell, the internal bit line is connected to discharge through the read selected memory cell.

Yet more aspects include a non-volatile memory circuit comprising a plurality of non-volatile memory cells, one or more bits lines each connected to one or more of the memory cells, a sense amplifier connectable to a of the one or more first bit lines, and one or more control circuits connected to the memory cells and to the sense amplifier. The sense amplifier includes: a capacitor; an internal bit line connected to a first plate of the capacitor and selectively connectable to one or more of the bit lines; a latch having an input node, connected to a second plate of the capacitor, and an output node; and an inverter having an input connected to the output node of the latch and an output connected to the internal bit line. The one or more control circuits are configured to: bias a selected one of the memory cells to conduct current at a level dependent on a data state stored in the selected memory cell, bias the sense amplifier to pre-charge the internal bit line and pre-charge the latch by shorting the input node of the latch to the output node of the latch; subsequent to pre-charging the internal bit line and the latch, discharge for a sensing interval the internal bit line through the selected memory cell at a rate based on a conductivity of the selected memory cell; and set a value of the output node of the latch based on a voltage level of the internal bit line subsequent to the sensing interval.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A sense amplifier, comprising:
    a capacitor having a first plate and a second plate;
    a first selection switch configured to connect the first plate of the capacitor to a selected memory cell;
    a first inverter having an input node and an output node, the input node connected to the second plate of the capacitor;
    a second inverter having an input node connected to the output node of the first inverter, an output node connected to the input node of the first inverter, and configured to form a latch with the first inverter;
    a shorting switch configured to connect the input node of the first inverter to the output node of the first inverter;
    a third inverter having an input node connected to the output node of the first inverter and an output node connected to the first plate of the capacitor; and
    one or more control circuits connected to the first selection switch, to the shorting switch, to the first inverter, to the second inverter and to the third inverters, the one or more control circuits configured to:
        pre-charge the first plate of the capacitor and, concurrently with pre-charging the first plate of the capacitor, enable the shorting switch to connect the input node of the first inverter to the output node of the first inverter; and
        subsequent to pre-charging the first plate of the capacitor, disable the shorting switch, connect the first plate of the capacitor to the selected memory cell by the first selection switch, and discharge the first plate of the capacitor at a rate dependent upon a conduction state of the selected memory cell.

2. The sense amplifier of claim 1, further comprising:
    an internal bit line by which the first plate of the capacitor is connected to the first selection switch; and
    a pre-charge switch connecting to the internal bit line to a pre-charge voltage level, wherein the one or more control circuits are configured to pre-charge the first plate of the capacitor through the pre-charge switch.

3. The sense amplifier of claim 2, wherein the first selection switch is configured to connect the internal bit line to a first bit line along which the selected memory cell is connected, the sense amplifier further comprising:
    a first programming data latch connected to the first bit line, the first programming data latch configured to bias the first bit line to one of either a program enable voltage level or a program inhibit voltage level.

4. The sense amplifier of claim 3, the sense amplifier further comprising:
    a plurality of selection switches, including the first selection switch, each configured to connect the internal bit line to a corresponding bit line; and
    a plurality of programming data latches, including the first programming data latch, each connected to a corresponding bit line and configured to bias the corresponding bit line to one of either a program enable voltage level or a program inhibit voltage level.

5. The sense amplifier of claim 3, wherein the one or more control circuits are further configured to:
    enable the first selection switch to transfer program data from the output node of the first inverter to the first programming data latch.

6. The sense amplifier of claim 1, wherein:
    the first selection switch includes a transfer gate comprising a PMOS device connected in parallel with an NMOS device; and the shorting switch includes a transfer gate comprising a PMOS device connected in parallel with an NMOS device.

7. The sense amplifier of claim 1, further comprising:
a data transfer latch connected between the output node of the first inverter and a data bus, wherein the one or more control circuits are configured to transfer data between output node of the first inverter and the data bus.

8. The sense amplifier of claim 1, wherein the first inverter is configured to have a gain greater than unity.

9. A method, comprising:
pre-charging a sense amplifier circuit, comprising:
pre-charging an internal bit line connected to a first plate of a sensing capacitor of the sense amplifier circuit; and
pre-charging a latch circuit of the sense amplifier circuit, the latch circuit including a first inverter having an input node connected to a second plate of the sensing capacitor and an output node connected to an input of a second inverter that has an output connected to the input of the first inverter, the sense amplifier circuit also including a third inverter having an input connected to the output node of the first inverter and an output connected to the internal bit line, and where pre-charging the latch circuit includes connecting the output node of the first inverter to the input node of the first inverter;
biasing a read selected memory cell to conduct current at a level dependent on a data state stored in the read selected memory cell; and
subsequent to pre-charging the sense amplifier circuit and while biasing the read selected memory cell to conduct current at the level dependent on the data state stored in the read selected memory cell, connecting the internal bit line to discharge through the read selected memory cell.

10. The method of claim 9, further comprising:
subsequent to connecting the internal bit line to discharge through the read selected memory cell for a sensing interval, latching the voltage level on the input node of the first inverter into the latch circuit.

11. The method of claim 10, wherein latching the voltage level on the input node of the first inverter into the latch circuit includes:
amplifying, by the first inverter, the voltage level on the input node of the first inverter with a gain of greater than unity.

12. The method of claim 11, further comprising:
subsequent to latching the voltage level on the input node of the first inverter into the latch circuit, transferring a voltage level latched on the output node of the first inverter to a data bus.

13. The method of claim 9, further comprising:
receiving first programming data at the output node of the first inverter from a data bus;
transferring the first programming data from the output node of the first inverter to the internal bit line;
transferring the first programming data from the internal bit line to a first programming latch associated with a first bit line; and
applying a programming pulse to a first write selected memory cell connected to the first bit line.

14. The method of claim 13, wherein the first program data is one of either a write inhibit value or a write enable value.

15. The method of claim 13, further comprising:
subsequent to transferring the first programming data from the internal bit line to the first programming latch associated with the first bit line and prior to applying the programming pulse to the first write selected memory cell:
receiving second programming data at the output node of the first inverter from the data bus;
transferring the second programming data from the output node of the first inverter to the internal bit line; and
transferring the second programming data from the internal bit line to a second programming latch associated with a second bit line; and
applying the programming pulse to a second write selected memory cell connected to the second bit line concurrently with applying the programming pulse to the first write selected memory cell.

16. A non-volatile memory circuit, comprising:
a plurality of non-volatile memory cells;
one or more bits lines each connected to one or more of the memory cells;
a sense amplifier connectable to a first of the one or more bit lines, the sense amplifier comprising:
a capacitor;
an internal bit line connected to a first plate of the capacitor and selectively connectable to one or more of the bit lines;
a latch having an input node, connected to a second plate of the capacitor, and an output node; and
an inverter having an input connected to the output node of the latch and an output connected to the internal bit line; and
one or more control circuits connected to the memory cells and to the sense amplifier and configured to:
bias a selected one of the memory cells to conduct current at a level dependent on a data state stored in the selected memory cell,
bias the sense amplifier to pre-charge the internal bit line and pre-charge the latch by shorting the input node of the latch to the output node of the latch;
subsequent to pre-charging the internal bit line and the latch, discharge for a sensing interval the internal bit line through the selected memory cell at a rate based on a conductivity of the selected memory cell; and
set a value of the output node of the latch based on a voltage level of the internal bit line subsequent to the sensing interval.

17. The non-volatile memory circuit of claim 16, wherein the sense amplifier further comprises:
a first bit line selection switch connected between the internal bit line and a first bit line of the one or more bit lines; and
a first programming latch connected to the first bit line and configured to bias the first bit line to one of either a program enable voltage or a program inhibit voltage, and
wherein the one or more control circuits connected are further configured to:
transfer a first programming value from the output node of the latch through the first bit line selection switch to the first programming latch;
bias the first bit line the one of either the program enable voltage or the program inhibit voltage based on the first programming value; and subsequent to biasing the first bit line, apply a programming voltage to a memory cell connected to the first bit line.

18. The non-volatile memory circuit of claim 17, wherein the sense amplifier further comprises:
a second bit line selection switch connected between the internal bit line and a second bit line of the one or more bit lines; and
a second programming latch connected to the second bit line and configured to bias the second bit line to one of either the program enable voltage or the program inhibit voltage, and
wherein the one or more control circuits connected are further configured to:
subsequent to transferring the first programming value from the output node of the latch to the first programming latch, transfer a second programming value from the output node of the latch through the second bit line selection switch to the second programming latch; and
biasing the second bit line the one of either the program enable voltage or the program inhibit voltage based on the second programming value; and
subsequent to biasing the second bit line, apply a programming voltage to a memory cell connected to the second bit line concurrently to applying the voltage to the memory cell connected to the first bit line.

19. The non-volatile memory circuit of claim 16, wherein the sense amplifier further comprises:
a switch connected between the input node of the latch and the output node of the latch, wherein the one or more control circuits are configured to short the input node of the latch to the output node of the latch by turning on the switch.

20. The non-volatile memory circuit of claim 16, wherein the latch comprises:
a first latch inverter having an input connected to the input node of the latch and an output connected to the output node of the latch; and
a second latch inverter having an input connected to the output node of the latch and an output connected to the input node of the latch.

* * * * *